United States Patent [19]
Sathrum et al.

[11] Patent Number: 5,458,754
[45] Date of Patent: Oct. 17, 1995

[54] PLASMA ENHANCEMENT APPARATUS AND METHOD FOR PHYSICAL VAPOR DEPOSITION

[75] Inventors: Paul E. Sathrum; Bernard F. Coll, both of Sparta, N.J.

[73] Assignee: Multi-Arc Scientific Coatings, Rockaway, N.J.

[21] Appl. No.: 228,185

[22] Filed: Apr. 15, 1994

Related U.S. Application Data

[63] Continuation of Ser. No. 92,670, Jul. 14, 1993, abandoned, which is a continuation of Ser. No. 689,313, Apr. 22, 1991, abandoned.

[51] Int. Cl.$^6$ ................................................... C23C 14/24
[52] U.S. Cl. ............................... 204/192.38; 204/298.41
[58] Field of Search ...................... 204/192.38, 298.41; 427/581

[56] References Cited

U.S. PATENT DOCUMENTS

| | | |
|---|---|---|
| 395,963 | 1/1989 | Edison . |
| 526,147 | 9/1994 | Edison . |
| 713,863 | 11/1902 | Edison . |
| 767,216 | 8/1904 | Edison . |
| 898,346 | 9/1908 | Ferranti . |
| T 904,020 | 5/1971 | Lane .................................. 204/192 |

(List continued on next page.)

FOREIGN PATENT DOCUMENTS

| | | |
|---|---|---|
| 209942 | 1/1968 | U.S.S.R. . |
| 321794 | 1/1972 | U.S.S.R. . |
| 329252 | 5/1972 | U.S.S.R. . |
| 484267 | 12/1975 | U.S.S.R. . |
| 359977 | 7/1976 | U.S.S.R. . |
| 367755 | 7/1976 | U.S.S.R. . |
| 284883 | 7/1976 | U.S.S.R. . |

OTHER PUBLICATIONS

Article: Aksenov et al., "Transport of Plasma Streams in a Curvilinear Plasma-Optics System," *Sov. J. Plasma Phys.*, Jul.–Aug., 1978, pp. 425–428.
Article: Aksenov et al., "Effect of Electron Magnetization in Vacuum-Arc Plasma on the Kinetics of the Synthesis of Nitrogen-Containing Coatings," *Sov. Phys. Tech. Phys.*, Feb. 1981, pp. 184–187.
Article: Aksenov et al., "Motion of Plasma Streams from a Vacuum Arc in a Long, Straight Plasma-Optics System," *Sov. J. Plasma Phys.*, Jul.–Aug., 1980, pp. 504–507.
Article: Randhawa, "High-Rate Deposition of $Al_2O_3$ Films Using Modified Cathodic Arc Plasma Deposition Processes," *J. Vac. Sci. Technol.*, May–Jun., 1989, pp. 2346–2349.
Article: Dorodnov et al., "Physical Principles and Types of Technological Vacuum Plasma Devices," *Sov. Phys. Tech. Phys.*, Mar. 1981, pp. 304–315.
Article: Dorodnov, "Technical Application of Plasma Accelerators," *Sov. Phys. Tech. Phys.*, Sep. 1978, pp. 1058–1065.

(List continued on next page.)

*Primary Examiner*—Nam Nguyen
*Attorney, Agent, or Firm*—Merchant, Gould, Smith, Edell, Welter & Schmidt

[57] ABSTRACT

The present invention provides a plasma enhancement method and apparatus for electric arc vapor deposition. The plasma enhancement apparatus is positioned to act upon plasma generated from a plasma source before the plasma reaches a substrate to be coated by the plasma. The plasma enhancement apparatus includes a magnet disposed about a magnet axis and defining a first aperture, and a core member disposed about a core member axis and at least partially nested within the first aperture. The core member defines a second aperture, and the plasma enhancement apparatus is arranged and configured in such a manner that the evaporated cathode source material passes from the cathode source and through the second aperture toward the substrate to be coated by the evaporated cathode source material. The plasma is favorably conditioned as it passes through the plasma enhancement apparatus.

38 Claims, 8 Drawing Sheets

U.S. PATENT DOCUMENTS

| | | | |
|---|---|---|---|
| 1,064,671 | 6/1913 | Simpson . | |
| 1,162,149 | 11/1915 | Eckhardt . | |
| 1,506,320 | 8/1924 | Northrup . | |
| 1,584,728 | 5/1926 | Case . | |
| 1,624,071 | 4/1927 | Richardson . | |
| 1,635,217 | 7/1927 | Kirchman . | |
| 1,833,640 | 11/1931 | Fruth . | |
| 1,887,577 | 11/1932 | Bridger . | |
| 1,982,012 | 11/1934 | Mingard . | |
| 2,103,623 | 12/1937 | Kott | 250/27.5 |
| 2,146,025 | 2/1939 | Penning | 250/27.5 |
| 2,148,045 | 2/1939 | Burkhardt et al. | 91/70.1 |
| 2,157,478 | 5/1939 | Burkhardt et al. | 91/70.1 |
| 2,157,498 | 5/1939 | Reinecke et al. | 91/12.2 |
| 2,164,595 | 7/1939 | Siebertz | 250/27.5 |
| 2,200,909 | 5/1940 | Berghaus et al. | 250/27.5 |
| 2,217,448 | 10/1940 | Muller | 250/27.5 |
| 2,251,510 | 8/1941 | Berghaus et al. | 204/192 |
| 2,257,411 | 9/1941 | Berghaus et al. | 250/27.5 |
| 2,307,749 | 1/1943 | Slepian | 219/15 |
| 2,843,542 | 7/1958 | Callahan | 204/192 |
| 2,884,894 | 5/1959 | Ruppert et al. | 118/48 |
| 2,900,548 | 8/1959 | Bostick et al. | 313/131 |
| 2,909,697 | 10/1959 | Bernas et al. | 313/63 |
| 2,916,409 | 12/1959 | Bucek | 148/10 |
| 2,920,234 | 1/1960 | Luce | 315/111 |
| 2,922,869 | 1/1960 | Giannini et al. | 219/75 |
| 2,932,588 | 4/1960 | Frank | 117/106 |
| 2,967,927 | 1/1961 | Weismann | 219/121 |
| 2,972,695 | 2/1961 | Wroe | 313/157 |
| 2,982,845 | 5/1961 | Yenni et al. | 219/76 |
| 3,007,072 | 10/1961 | McGinn et al. | 313/231 |
| 3,010,009 | 11/1961 | Ducati | 219/76 |
| 3,016,447 | 1/1962 | Gage et al. | 219/76 |
| 3,055,591 | 9/1962 | Shepard | 239/13 |
| 3,071,491 | 1/1963 | Horn et al. | 117/50 |
| 3,075,066 | 1/1963 | Yenni et al. | 219/76 |
| 3,085,317 | 4/1963 | Stackhouse | 29/183.5 |
| 3,097,154 | 7/1963 | Eck et al. | 204/192 |
| 3,131,276 | 4/1964 | Watson | 209/144 |
| 3,139,509 | 6/1964 | Browning | 219/75 |
| 3,141,826 | 7/1964 | Friedrichs et al. | 176/7 |
| 3,141,989 | 7/1964 | Jones et al. | 313/210 |
| 3,158,805 | 11/1964 | Kalbfell | 324/34 |
| 3,192,892 | 7/1965 | Hanson et al. | 118/49.1 |
| 3,202,862 | 8/1965 | Paley | 313/357 |
| 3,205,338 | 9/1965 | Sunnen | 219/121 |
| 3,210,263 | 10/1965 | Jones | 204/298 |
| 3,239,368 | 3/1966 | Goodman | 117/93.1 |
| 3,243,493 | 3/1966 | Bunshah et al. | 13/31 |
| 3,246,070 | 4/1966 | Wooding | 13/31 |
| 3,248,513 | 4/1966 | Sunnen | 219/76 |
| 3,283,205 | 11/1966 | de Bolt | 315/111 |
| 3,294,583 | 12/1966 | Fedows-Fedotowsky | 117/227 |
| 3,294,669 | 12/1966 | Theuerer | 204/298 |
| 3,325,392 | 6/1967 | Rummel | 204/192 |
| 3,328,200 | 6/1967 | Neugebauer | 117/213 |
| 3,329,601 | 7/1967 | Mattox | 204/298 |
| 3,351,543 | 11/1967 | Vanderslice | 204/192 |
| 3,369,989 | 2/1968 | Kay et al. | 204/298 |
| 3,404,084 | 10/1968 | Hamilton | 204/298 |
| 3,408,283 | 10/1968 | Chopra et al. | 204/298 |
| 3,420,767 | 1/1969 | Carlson | 204/298 |
| 3,428,546 | 2/1969 | Baum et al. | 204/298 |
| 3,437,734 | 4/1969 | Roman et al. | 13/31 |
| 3,446,932 | 5/1969 | Belopitov | 219/76 |
| 3,457,156 | 7/1969 | Fisher | 204/168 |
| 3,472,751 | 10/1969 | King | 204/192 |
| 3,474,279 | 10/1969 | Kemeny et al. | 313/231 |
| 3,475,161 | 10/1969 | Ramirez | 117/46 |
| 3,475,315 | 10/1969 | Moseson | 204/298 |
| 3,476,586 | 11/1969 | Valtchev et al. | 117/71 |
| 3,476,971 | 11/1969 | Ligenza et al. | 313/231 |
| 3,482,133 | 12/1969 | Dugdale et al. | 313/210 |
| 3,492,152 | 1/1970 | Cariou et al. | 117/93.4 |
| 3,492,153 | 1/1970 | Ervin, Jr. | 117/106 |
| 3,501,393 | 3/1970 | Wehner et al. | 204/298 |
| 3,528,387 | 9/1970 | Hamilton | 118/49.1 |
| 3,546,091 | 12/1970 | Rossner et al. | 204/298 |
| 3,555,238 | 1/1971 | Fay et al. | 219/98 |
| 3,556,048 | 1/1970 | Paine | 118/49.5 |
| 3,562,141 | 2/1971 | Morley | 204/298 |
| 3,573,098 | 3/1971 | Bieber et al. | 117/212 |
| 3,573,185 | 3/1971 | Jennings et al. | 204/192 |
| 3,583,361 | 6/1971 | Laudel, Jr. | 118/49.5 |
| 3,604,970 | 9/1971 | Culbertson | 313/107 |
| 3,629,095 | 12/1971 | Jackson et al. | 204/298 |
| 3,640,689 | 2/1972 | Glaski et al. | 29/195 |
| 3,645,710 | 2/1972 | Plumat et al. | 65/30 |
| 3,656,995 | 4/1972 | Reedy, Jr. | 117/69 |
| 3,661,758 | 5/1972 | Jackson et al. | 204/298 |
| 3,669,871 | 6/1972 | Elmgren et al. | 204/298 |
| 3,684,585 | 8/1972 | Stroup et al. | 148/6 |
| 3,691,053 | 9/1972 | James et al. | 204/298 |
| 3,699,034 | 10/1972 | Lins et al. | 204/192 |
| 3,708,325 | 1/1973 | Kurtz et al. | 117/61 |
| 3,709,809 | 1/1973 | Wright et al. | 204/192 |
| 3,715,625 | 2/1973 | Ehlers | 317/4 |
| 3,719,582 | 3/1972 | Hansen et al. | 204/298 |
| 3,721,577 | 3/1973 | Woerner | 117/46 |
| 3,756,193 | 9/1973 | Carmichael et al. | 118/49.1 |
| 3,769,008 | 10/1973 | Borok et al. | 75/225 |
| 3,776,762 | 12/1973 | Bernath | 117/93.1 |
| 3,783,231 | 1/1974 | Sablev et al. | 219/123 |
| 3,784,401 | 1/1974 | Reedy, Jr. | 117/69 |
| 3,787,223 | 1/1974 | Reedy, Jr. | 117/69 |
| 3,793,179 | 2/1974 | Sablev et al. | 204/298 |
| 3,799,862 | 3/1974 | Krutenat | 204/298 |
| 3,832,514 | 8/1974 | Antonov | 219/76 |
| 3,836,451 | 9/1974 | Snaper | 204/298 |
| 3,854,984 | 12/1974 | Schadler et al. | 117/93.3 |
| 3,874,900 | 4/1975 | Post et al. | 117/69 |
| 3,882,579 | 5/1975 | Peacock | 29/95 R |
| 3,891,884 | 6/1975 | Tisdale | 313/107 |
| 3,895,923 | 7/1975 | Wakefield | 29/191 |
| 3,900,592 | 8/1975 | Kennedy et al. | 427/39 |
| 3,901,784 | 8/1975 | Quinn et al. | 204/192 |
| 3,904,505 | 9/1975 | Aisenberg | 204/298 |
| 3,908,183 | 9/1975 | Ennis, Jr. | 357/65 |
| 3,912,826 | 10/1975 | Kennedy | 427/8 |
| 3,913,520 | 10/1975 | Berg et al. | 118/7 |
| 3,915,757 | 10/1975 | Engel | 148/6 |
| 3,917,992 | 11/1975 | Volkov et al. | 323/6 |
| 3,922,214 | 11/1975 | Van Cakenberghe | 204/298 |
| 3,922,405 | 11/1975 | Komatsu et al. | 427/399 |
| 3,925,177 | 12/1975 | Kofoid | 204/164 |
| 3,928,159 | 12/1975 | Tadokoro et al. | 204/192 |
| 3,935,377 | 1/1976 | Gamble | 174/153 R |
| 3,948,211 | 4/1976 | Griboedov et al. | 118/48 |
| 3,959,557 | 5/1976 | Berry | 428/368 |
| 3,961,103 | 6/1976 | Aisenberg | 427/39 |
| 3,962,988 | 6/1976 | Murayama et al. | 118/49.1 |
| 3,964,937 | 6/1976 | Post et al. | 148/6.35 |
| 3,974,059 | 8/1976 | Murayama | 204/298 |
| 3,988,515 | 10/1976 | Hashimoto et al. | 427/249 |
| 3,988,955 | 11/1976 | Engel et al. | 83/661 |
| 3,990,390 | 11/1976 | Plyshevsky et al. | 118/49 |
| 4,001,461 | 1/1977 | Bykhovsky | 427/37 |
| 4,016,013 | 4/1977 | Bitzer et al. | 148/16.5 |
| 4,016,037 | 4/1977 | White | 219/10.49 |
| 4,018,631 | 4/1977 | Hale | 148/31.5 |
| 4,019,873 | 4/1977 | Reiter | 428/217 |

| | | | |
|---|---|---|---|
| 4,027,367 | 6/1977 | Rondeau | 428/652 |
| 4,052,530 | 10/1977 | Fonzi | 428/552 |
| 4,054,426 | 10/1977 | White | 51/309 R |
| 4,057,476 | 11/1977 | Krikorian et al. | 204/192 R |
| 4,066,821 | 1/1978 | Cook et al. | 428/539 |
| 4,075,376 | 2/1978 | Jaeger | 428/36 |
| 4,078,163 | 3/1978 | Tanaka et al. | 428/328 |
| 4,082,636 | 4/1978 | Takagi | 204/192 N |
| 4,098,956 | 7/1978 | Blickensderfer et al. | 428/627 |
| 4,103,042 | 7/1978 | Winters | 427/38 |
| 4,104,096 | 8/1978 | Gass et al. | 156/89 |
| 4,109,157 | 8/1978 | Tanaka et al. | 250/531 |
| 4,112,148 | 9/1978 | Fonzi | 427/248 C |
| 4,151,325 | 4/1979 | Welch | 428/432 |
| 4,152,478 | 5/1979 | Takagi | 428/221 |
| 4,153,483 | 5/1979 | Holzl | 148/31.5 |
| 4,153,529 | 5/1979 | Little et al. | 204/192 EC |
| 4,162,954 | 7/1979 | Morrison, Jr. | 204/298 |
| 4,169,913 | 10/1979 | Kobayashi et al. | 428/217 |
| 4,170,662 | 10/1979 | Weiss et al. | 427/38 |
| 4,175,029 | 11/1979 | Kovalsky et al. | 204/298 |
| 4,180,450 | 12/1979 | Morrison, Jr. | 204/298 |
| 4,194,930 | 3/1980 | Tanaka et al. | 148/16.6 |
| 4,197,175 | 4/1980 | Moll et al. | 204/192 R |
| 4,208,543 | 6/1980 | Boyle et al. | 174/152 R |
| 4,226,697 | 10/1980 | Antonov et al. | 204/298 |
| 4,238,525 | 12/1980 | Aichert et al. | 427/42 |
| 4,239,611 | 12/1990 | Morrison, Jr. | 204/298 |
| 4,265,729 | 5/1981 | Morrison, Jr. | 204/298 |
| 4,266,111 | 5/1981 | Trillwood | 219/121 EN |
| 4,271,348 | 6/1981 | Nakazaki et al. | 219/121 ED |
| 4,273,986 | 6/1981 | Edson et al. | 219/123 |
| 4,275,286 | 6/1981 | Hackett, Jr. | 219/121 EK |
| 4,278,868 | 7/1981 | Rudd et al. | 219/123 |
| 4,281,030 | 7/1981 | Silfvast | 427/42 |
| 4,301,352 | 11/1981 | Shipai et al. | 219/121 PR |
| 4,304,978 | 12/1981 | Saunders | 219/121 |
| 4,308,446 | 12/1981 | Okane et al. | 219/123 |
| 4,309,587 | 1/1982 | Nakano et al. | 219/73.11 |
| 4,314,142 | 2/1982 | Brown et al. | 219/384 |
| 4,317,983 | 3/1982 | Scheffels et al. | 219/121 EA |
| 4,319,121 | 3/1982 | Yoshida | 219/131 ED |
| 4,319,123 | 3/1982 | Pache et al. | 219/123 |
| 4,321,453 | 3/1982 | Terai et al. | 219/121 ED |
| 4,321,455 | 3/1982 | Hill | 219/123 |
| 4,328,411 | 5/1982 | Haller et al. | 219/121 EH |
| 4,330,911 | 5/1982 | Kapaan et al. | 29/148.4 A |
| 4,335,297 | 6/1982 | Little | 219/121 EQ |
| 4,335,314 | 6/1982 | Geerk et al. | 250/492.3 |
| 4,336,441 | 6/1982 | Godai et al. | 219/137 WM |
| 4,341,938 | 7/1982 | Matsubara et al. | 219/61 |
| 4,341,944 | 7/1982 | Breen | 219/123 |
| 4,342,577 | 8/1982 | Bhatti et al. | 65/1 |
| 4,343,636 | 8/1982 | Bhatti | 65/1 |
| 4,348,216 | 9/1982 | Bhtti et al. | 65/1 |
| 4,350,866 | 9/1982 | Zasio et al. | 219/121 EM |
| 4,360,956 | 11/1982 | Hiller | 29/156.5 R |
| 4,430,184 | 2/1984 | Mularie | 204/192 R |
| 4,448,659 | 5/1984 | Morrison, Jr. | 204/192 R |
| 4,448,799 | 5/1984 | Bergman et al. | 427/37 |
| 4,452,686 | 6/1984 | Axenov et al. | 204/298.41 |
| 4,495,044 | 1/1985 | Banks | 204/192.38 X |
| 4,512,867 | 4/1985 | Andreev et al. | 204/298 |
| 4,551,221 | 11/1985 | Axenov et al. | 204/298.41 |
| 4,559,121 | 12/1985 | Mularie | 204/192 R |
| 4,620,913 | 11/1986 | Bergman | 204/298.41 X |
| 4,670,625 | 6/1987 | Wood et al. | 174/142 |
| 4,769,101 | 9/1988 | Ribeiro | 204/298.41 X |
| 4,915,977 | 4/1990 | Okamoto et al. | 204/192.38 X |
| 4,929,321 | 5/1990 | Buhl | 204/192.38 |
| 4,929,322 | 5/1990 | Sue et al. | 204/192.38 |
| 5,104,509 | 4/1992 | Buck et al. | 204/192.38 |
| 5,126,030 | 6/1992 | Tamagaki et al. | 204/298.38 |

OTHER PUBLICATIONS

Paper: Martin et al., "Characteristics of Titanium Arc Evaporation Processes," presented at the 14th International Conference on Metallurgical Coatings, San Diego, Cal., U.S.A., Mar. 23–27, 1987, pp. 91–102.

Paper: Sanders et al., "Magnetic Enhancement of Cathodic Arc Deposition," *J. Vac. Sci. Tech.* 19-page manuscript (undated).

Article: Sanders, "Review of Ion–Based Coating Processes Derived From the Cathodic Arc," *J. Vac. Sci. Technol.*, May–Jun., 1989, pp. 2339–2345.

Transverse Magnetic Field Strength at Cathode Face (FOR ARC STABILITY)

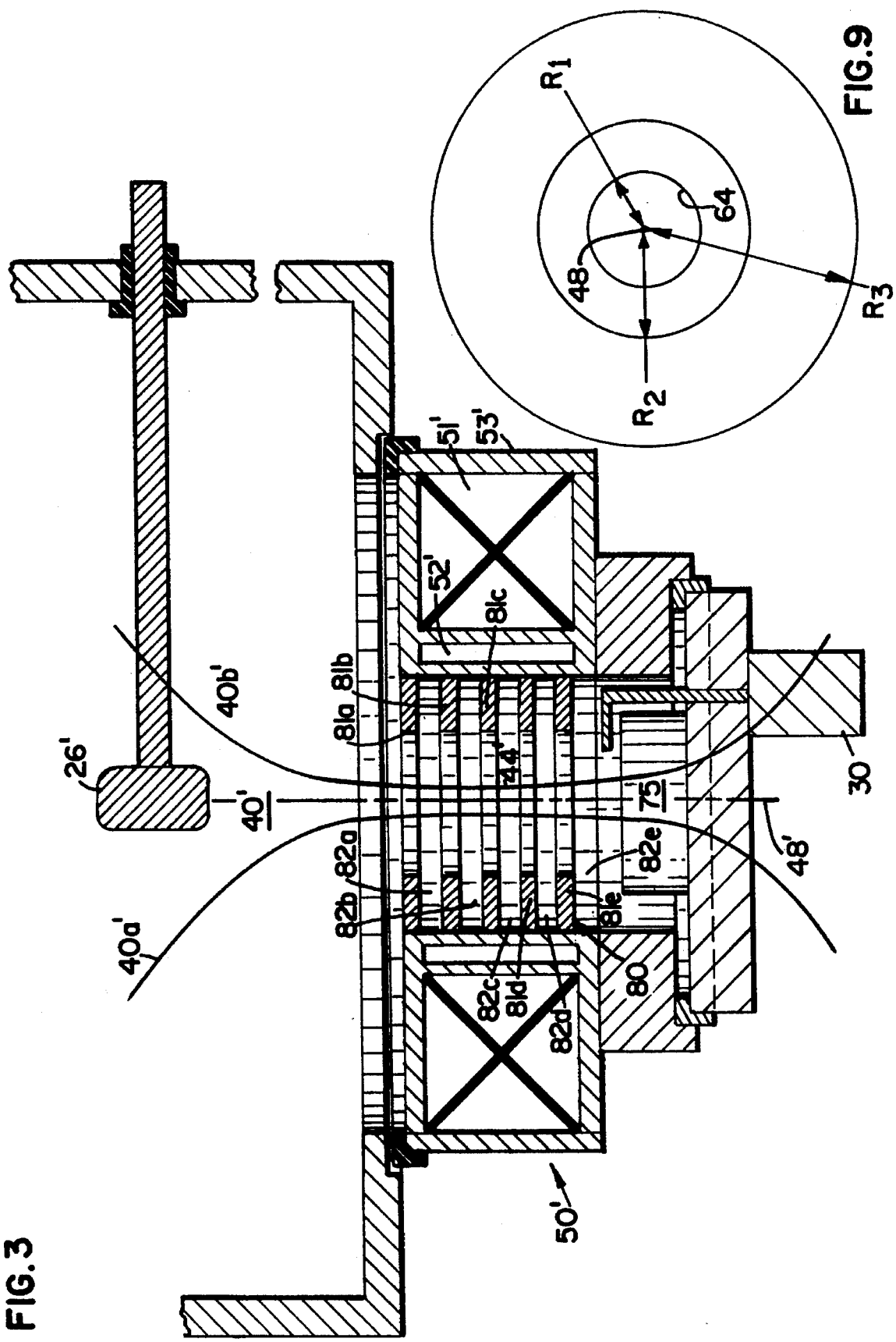

PLASMA ENHANCEMENT APPARATUS AND METHOD FOR PHYSICAL VAPOR DEPOSITION

This is a continuation of application Ser. No. 08/092,670, filed Jul. 14, 1993, which was abandoned upon the filing hereof, which is a continuation of application Ser. No. 07/689,313 filed Apr. 22, 1991, which was abandoned upon the filing hereof.

FIELD OF THE INVENTION

This invention relates generally to a vapor deposition apparatus, and more particularly, to a plasma enhancement apparatus, or "plasma guide," for physical vapor deposition.

CROSS REFERENCE TO RELATED PATENTS

To the extent that the disclosures of U.S. Pat. No. 3,625,848 to Snaper, U.S. Pat. No. 3,793,179 to Sablev, et al., U.S. Pat. No. 4,448,799 to Bergman, et al., and U.S. Pat. No. 4,485,759 to Brandolf are relevant to understand the principles of this invention, they are herein incorporated by reference.

BACKGROUND OF THE INVENTION

General

A number of disciplines have been developed over the years in the vapor deposition art for applying or depositing a coating layer on a substrate surface within a vapor deposition chamber. Certain fundamental process steps are the same for all of the vapor deposition disciplines, although a large number of variations and techniques in implementing the process steps have been developed. Generally, the substrate to be coated is placed within a deposition chamber, which is typically evacuated or pressurized to a desired pressure. The coating material to be deposited on the substrate is generated within or introduced into the chamber, and assumes the form of a plasma that includes gaseous vapors and solid particulate matter. The plasma may include atoms, molecules, ions, and agglomerates of molecules of the coating material, as well as those of any desired reactant agents and any undesired impurities. The coating or deposition process itself occurs by condensation of the plasma coating particles onto the substrate surface(s) to be coated.

Vapor deposition coating processes are generally categorized into "chemical" and "physical" vapor deposition disciplines. Both generally incorporate a deposition or coating chamber in which a "plasma" of the coating material is produced and projected toward a substrate to be coated. The uses of the coatings applied to substrates, and the shapes and materials of the substrates can vary widely, from decorative coatings on ceramic or pottery materials, to circuit interconnection wiring paths on the surfaces of semi-conductor chips, to wear-resistant coatings on cutting tool and bearing surfaces. Similarly, the physical nature and properties of the coating materials vary widely, from conductive coatings, to semiconductive coatings, to those forming electrical insulators.

Chemical Vapor Deposition

Chemical vapor deposition generally refers to that vapor deposition process wherein reactive gaseous elements are introduced into a deposition chamber and react to form gaseous compounds that comprise the coating plasma. The deposition chamber may be evacuated prior to a deposition "run" to purge the chamber of impurities, but in general, chemical vapor deposition is performed at atmospheric or at positive (above atmospheric) pressure levels. Also typical of chemical vapor deposition techniques is the fact that the plasma particles do not generally follow straight-line or line-of-sight paths from the reactive sources to the substrates.

Physical Vapor Deposition

In contrast, physical vapor deposition processes generally require evacuation of the deposition chamber prior to, and maintenance of a negative pressure level during, the deposition coating process. At least a portion of the coating material to be deposited is generally present in the deposition chamber in non-gaseous form. Prior to evacuation of the chamber, the typically solid sacrificial source material is acted upon by an energy stimulus that converts the solid source material into a vaporous plasma of coating material. Once converted into a plasma, a coating source material may be combined with reactive gases or other elements within the chamber to form coating compounds and molecules prior to actual deposition thereof onto substrate(s). The coating plasma typically includes atoms, molecules, ions, ionized molecules, and agglomerates of molecules. The deposition process can be enhanced by creating ionic attraction between the plasma particles and the substrate surface(s).

There are a number of different physical vapor deposition techniques, which are distinguished by the manner in which the source material is vaporized. The most commonly used physical vapor deposition techniques for converting the solid coating source material into a gaseous/vapor plasma are: (a) resistance or induction heating; (2) electron beam or ion bombardment; and (3) electric arc.

With resistance and induction heating techniques, the coating source material is brought to its melting point by an external heat source or by passing high electric current levels through the coating source material. The source material, or a portion thereof, first melts to a molten liquid state, and then vaporizes to a gaseous state to form the coating plasma. This technique has been used for depositing thin film circuit patterns on hybrid circuit substrates, and for depositing metalization interconnection patterns and layers on semi-conductor chip surfaces.

With electron beam and ion bombardment techniques, a molten pool of coating source material is created by bombarding the solid coating source material with a high-energy beam of electrons and/or ions. In such art, the solid source material is typically referred to as a "target", toward which the electrons and/or ions are accelerated. The bombarding electrons and/or ions impart sufficient kinetic energy to the target source coating material, causing atoms, ions, molecules, ionized molecules, and agglomerates of molecules to leave the target source material in the form of a coating plasma. This physical vapor deposition method, while more practical than the resistance or inductive heating method for coating larger work pieces such as cutting tools, is costly due to the expensive equipment required for generating and directing the electron and/or ion beam toward the target area. The energy level of coating plasma particles generated by the two physical vapor deposition techniques described above is relatively low.

Physical Deposition by Electric Arc

The present invention relates to the third listed physical vapor deposition technique (i.e., to that of electric arc, also referred to as cathodic arc vapor deposition). Various known electric arc vapor deposition techniques are disclosed in U.S.

Pat. No. 3,625,848 to Snaper and U.S. Pat. No. 3,793,179 to Sablev, et al. U.S. Pat. No. 4,448,799 to Bergman, et al., and U.S. Pat. No. 4,485,759 to Brandolf.

In electric arc physical vapor deposition, an electric arc is struck and maintained between the coating source material, which is typically electrically biased to serve as a cathode, and an anode that is spaced apart from the cathode. An arc-initiating trigger element is positioned proximate the cathode source and is positively biased with respect to the cathode. The trigger element is momentarily allowed to engage the surface of the cathode material, establishing a current flow path though the trigger and cathode. As the trigger element is removed from engagement with the cathode source, an electrical arc is struck, which arc is thereafter maintained between the cathode and the anode electrodes of the chamber. The electric arc carries high electric current levels, typically ranging from 30 to several hundred amperes, and provides energy for vaporizing the coating source material. The arc terminus is visible on the surface of the cathode, where the arc "touches" the cathode, and is typically referred to as a "cathode spot". One or more of such cathode spots may exist on the cathode surface at one time, depending upon the current present in the arc. The cathode spot(s) randomly move across the surface of the source material, instantaneously vaporizing the coating source material into a coating plasma. The plasma typically contains atoms, molecules, ions, and agglomerates of molecules, and generally, both ionically charged and neutral particles. Plasma particles created by an electric arc generally leave the solid source material at significantly higher energy levels than those created by the other physical vapor deposition techniques. The electric arc technique has been found to be particularly attractive for commercial coating applications, particularly to the economical formation of wear-resistant coatings on surfaces of cutting tools, bearings, gears, and the like.

One type of coating source material that is often used for the cathode of electric arc vapor deposition machines is titanium (Ti). When a titanium source material is used, a reactive gas such as nitrogen (N) is often introduced into the deposition chamber during the vaporization of the titanium source. The nitrogen gas reacts with the titanium, and the coating plasma within the chamber comprises Ti, $N_2$ and TiN. TiN forms a gold-colored coating that has been found to be a very durable coating for cutting tools and the like.

Another desirable cathode material is graphite, which produces carbon (C) plasma that forms a diamond-like coating when deposited. Chemical vapor deposition techniques are available for forming such diamond-like coatings, but the amount of hydrogen (H) present in the system must be carefully controlled in order to eliminate or minimize the formation of undesirable hydrocarbons in the structure of the coating film. By using electric arc vapor deposition, the system could be evacuated and made substantially hydrogen-free, and then a controlled partial pressure of hydrogen could be injected into the system. However, it is relatively difficult to form homogeneous, smooth carbon coatings by electric arc physical vapor deposition techniques, because the arc tends to remain in fixed spots on a graphite cathode, dislodging undesirable, large pieces (macroparticles) of the graphite cathode into the coating plasma.

In all deposition coating processes, it is desirable to form smooth, homogeneous films on the substrate which are free of macroparticles, which can otherwise degrade film properties. Attaining this goal with electric arc deposition is more difficult than with other types of physical vapor deposition, since it is difficult to control the high energy levels incident to use of an arc, and since the presence of the arc energy within the deposition chamber has oftentimes eliminated use of or minimized the effectiveness of apparatus and techniques available to other physical vapor deposition methods. Attempts have been made to "shield" the macroparticles, but any such shielding is relatively inefficient because a portion of the coating material is lost to the shield, and further, the shield must be periodically replaced as coating material accumulates on it.

Those skilled in the art are aware of the need to control movement of the arc or cathode spot(s) over the surface of the cathode source so as to maximize the efficiency of the cathode disintegration and the uniformity of the plasma generated from the source. It has been recognized in the art that magnetic and electric fields can be used to help maintain the cathode spot(s) on the desired evaporation surface(s) of the cathodic source, and to control the movement pattern of the cathode spot(s) over the evaporation surface. It has also been recognized in the physical vapor deposition art that electric and magnetic fields can be used to some advantage in helping (1) to direct the coating plasma, and particularly an ionized plasma, toward the substrate to be coated; (2) to produce higher levels of vapor ionization; and (3) to increase the deposition rate. However, none of the prior art structures or methods has provided a single simple, efficient, and practical approach for using magnetic and electrical fields in a manner that simultaneously provides all of these features in an electric arc physical deposition environment. Further, none of the prior art attempts at solving such problems has provided the flexibility to be readily applied to different cathode source materials requiring different deposition conditions, such as titanium and carbon. The present invention provides a simple yet effective way of simultaneously addressing the above-described needs/problems and concerns of the electric arc physical vapor deposition art.

SUMMARY OF THE INVENTION

The present invention provides a plasma enhancement method and apparatus for electric arc vapor deposition. The plasma enhancement apparatus is positioned to act upon plasma generated from a plasma source before the plasma reaches a substrate to be coated by the plasma. The plasma enhancement apparatus includes a magnet disposed about a magnet axis and defining a first aperture, and a core member disposed about a core member axis and at least partially nested within the first aperture. The core member defines a second aperture, and the plasma enhancement apparatus is arranged and configured in such a manner that the evaporated cathode source material passes from the cathode source and through the second aperture toward the substrate to be coated by the evaporated cathode source material. The plasma is favorably conditioned as it passes through the plasma enhancement apparatus.

The present invention combines the use of electric and magnetic fields generated by plasma enhancement apparatus within and/or around the deposition chamber to directly control and influence the creation and flow of the coating plasma from the source cathode to the substrate. The principles of this invention provide for (1) increased ion density at the cathode, yielding increased thermionic emission; (2) stabilization of the arc on the cathode surface at relatively low arc currents; (3) the facilitation of evaporation of heretofore difficult materials such as carbon, refractory metals, and doped ceramics; and (4) the reduction of macroparticle emission from the cathode. Further, the present invention provides a method of coating by electric arc vapor deposition a substrate with a diamond-like film that is virtually free of hydrogen.

This invention provides for creation of a controllable plasma convergence zone intermediate the source and substrate which purifies the plasma stream of macroparticles and increases ionization energy in the plasma stream, yielding coating films of increased density, hardness, and better adhesion and enhancing synthesis reactions during reactive deposition. The present invention also enables greater flexibility in control over the shape and direction of the plasma stream which can be made to correspond more closely to the desired deposition profile for the substrate.

BRIEF DESCRIPTION OF THE DRAWING

Referring to the Figures, wherein like numerals represent like parts throughout the several views:

FIG. 3 is a sectional view illustrating a second embodiment of the plasma enhancement apparatus of FIG. 1 together with the immediately adjacent deposition chamber structure;

FIG. 9 is a top elevational view of the arc enhancement apparatus shown in FIG. 2.

DETAILED DESCRIPTION OF THE INVENTION

Vapor Deposition System

Figure 1:
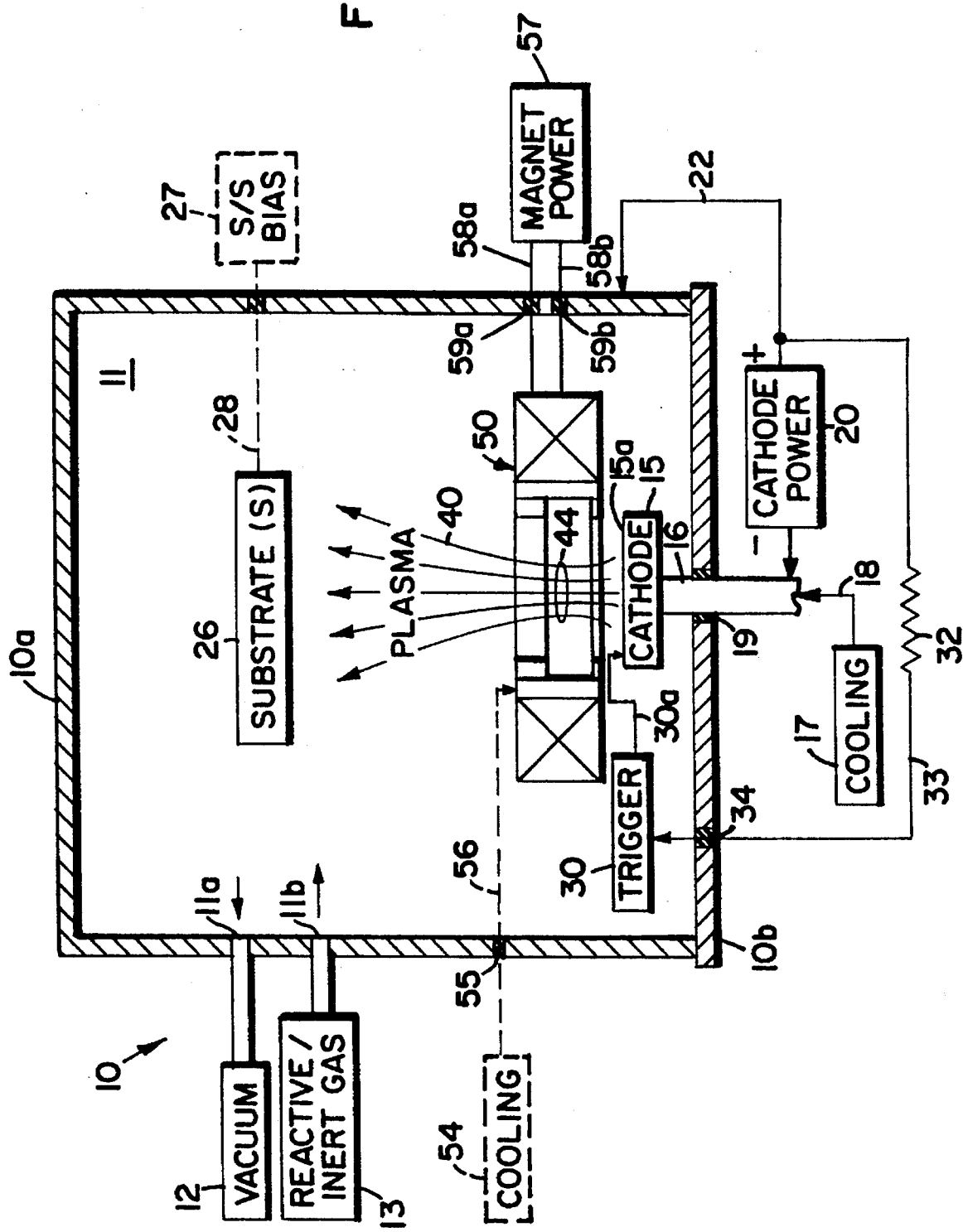
FIG. 1 is a diagrammatic view of an electric arc deposition chamber, including a plasma enhancement apparatus configured according to a preferred embodiment of the present invention.

Referring to the drawing, there is generally illustrated in FIG. 1, a diagrammatic representation of an electric arc vapor deposition system with which the present invention can be used. It is emphasized that FIG. 1 is only a diagrammatic representation of such a system, which generally schematically illustrates those basic portions of an electric arc vacuum vapor deposition system that are relevant to a discussion of the present invention, and that such diagram is by no means complete in detail. For a more detailed description of electric arc vapor deposition systems and various portions thereof, one may refer to U.S. Pat. Nos. 3,793,179 to Sablev, et al., 4,485,759 to Brandolf, 4,448,799 to Bergman, et al., and 3,625,848 to Snaper. To the extent that such additional disclosure is necessary for an understanding of this invention, the disclosures and teachings of such patents are herein incorporated by reference.

Referring to FIG. 1, there is generally illustrated at 10 a vapor vacuum deposition chamber having a first wall chamber portion 10a and a second wall chamber portion 10b appropriately connected together (by means not illustrated) to form an enclosed inner cavity 11 that defines a deposition chamber in which substrates are to be coated. A vacuum pumping system, diagrammatically illustrated at 12, communicates with the inner cavity 11 by means of an outlet port 11a, and is operable to suitably evacuate the chamber, as is well known by those skilled in the part. Appropriate means for inserting reactive or inert gases to the inner cavity 11 during various process steps of the deposition procedures are generally illustrated at 13 and communicate with the inner cavity 11 by means of an inlet port 11b. Other general purpose inlet and outlet ports may be provided for opening into the inner cavity 11, but are not illustrated or described herein.

A source of coating material 15, referred to in FIG. 1 as the "Cathode," represents the origin of coating vapor or "plasma" for the vapor deposition coating process, and represents one electrode of an arc generating apparatus. In an electric arc vapor deposition system, such source of coating material generally represents a physical mass of coating material, such as titanium, in solid form. The physical shape of the source material can vary, for example, from cylindrical, to rectangular to irregular. The type of source material can also significantly vary, from conductive, to semiconductive, to insulative. In a preferred embodiment of the invention, the source material is titanium. The titanium source 15 is mounted in the deposition cavity 11 by appropriate mounting means, generally illustrated at 16 in FIG. 1, and typically has at least a portion thereof projecting outwardly through one of the chamber walls to the atmospheric environment. In the diagrammatic illustration of FIG. 1, the mounting means 16 is illustrated as projecting through the second chamber wall portion 10b. Due to the high electrical current levels passing through the cathode during electric arc vapor deposition processes, the cathode gets extremely hot, typically requiring external cooling. Such cooling is typically provided by a water flow-through system, schematically illustrated at 17 in FIG. 1, which communicates with the cathode mounting apparatus 16 by means of a flow path 18. Appropriate vacuum seal and electrical isolation means, generally illustrated at 19, are provided for maintaining the vacuum within the deposition cavity 11 and for electrically isolating the cathode source 15 from the deposition chamber wall portions 10a and 10b.

A primary DC power supply, designated as "cathode power" in FIG. 1, for generating and maintaining the electric arc energy of the system is illustrated at 20. The negative terminal of the power supply 20 is electrically connected to the cathode 15 through the cathode mounting means 16 by means of a signal flow path 21. The positive terminal of the power supply 20 is directly connected to the wall chamber portion 10a by means of a signal flow path 22.

Those items to be coated within the chamber 11 are typically referred to as substrates, and are generally illustrated at 26 in FIG. 1. The substrates are appropriately mounted within the chamber, and may also be electrically biased, as diagrammatically illustrated by the substrate bias supply functional block 27 and the signal flow path 28. The substrates 26 can also be heated by appropriate heating means (not illustrated). It will be understood that the relative spacings illustrated between components such as the cathode, anode and substrate(s) in FIG. 1 are diagrammatic in nature and are not intended to be represented to scale or as they would actually appear relative to one another in an operative system.

An arc-initiating trigger assembly is diagrammatically illustrated at 30. The trigger assembly 30 may be of any appropriate construction, such as for example the pneumatically operated trigger apparatus of U.S. Pat. No. 4,448,799, or of any other configuration that is operable to initiate an arc between the cathode 15 and the wall chamber portion 10a. Electrical power for initiating an arc on the cathode surface 15a is provided to the trigger from the output terminal of the power supply 20, typically through a resistor 32 and a signal flow path 33. The signal flow path 33 passes through the chamber wall 10b by means of an insulating seal member generally designated at 34. When an arc-initiating wire member is positioned so as to engage the upper surface 15a of the cathode 15, an electrical closed circuit is established from the positive output terminal of the power supply 20, through the resistor 32, the signal flow path 33, the arc-initiating trigger wire 30a, through the cathode 15 and cathode support structure 16 and back to the negative output terminal of the power supply 20. When the trigger 30 operates so as to lift the wire member out of engagement with the upper surface 15a of the cathode source 15, the electrical circuit path between the wire and cathode surface 15a is broken, causing an electrical arc to jump the gap therebetween and to initiate an electric arc on the cathode surface 15a. In an evacuated chamber 11, upon initiation of the electric arc, the arc path immediately extends between the cathode source 15 and the anode portions of the chamber, and is thereafter maintained by the power supply 20. It will be understood that a number of variations of applying and supplying electrical current to trigger assemblies such as 30 can be configured, as will be appreciated by those skilled in the art, and that the particular diagrammatic representation illustrated in FIG. 1 is only conceptual in nature.

As previously described herein, such electric arc paths carry high electric current levels, typically in excess of 30 amperes. The high concentration of electric energy passing through the arc(s), visible as intensely bright spots on the cathode surface 15a, liberates cathode material to form a coating vapor or plasma, generally illustrated at 40 in FIG. 1. Material liberated from the cathode surface generally travels outwardly from the cathode source surface 15a. The substrate 26 is appropriately mounted and/or biased so as to intercept the coating vapor 40, and the substrate 26 is coated thereby, in manners well-known in the art.

Plasma Enhancement Apparatus

The present invention provides a plasma enhancement apparatus 50 (also generally referred to herein as a "plasma guide") positioned in the cavity 11 between the titanium cathode 15 and the substrate(s) 26. Those skilled in the art will recognize that the plasma enhancement apparatus 50 need not be placed entirely within the cavity 11, so long as the plasma guide 50 is positioned to act upon the plasma leaving the cathode. In this regard, the plasma enhancement apparatus itself may function as a part of the cavity enclosure.

Figure 2:
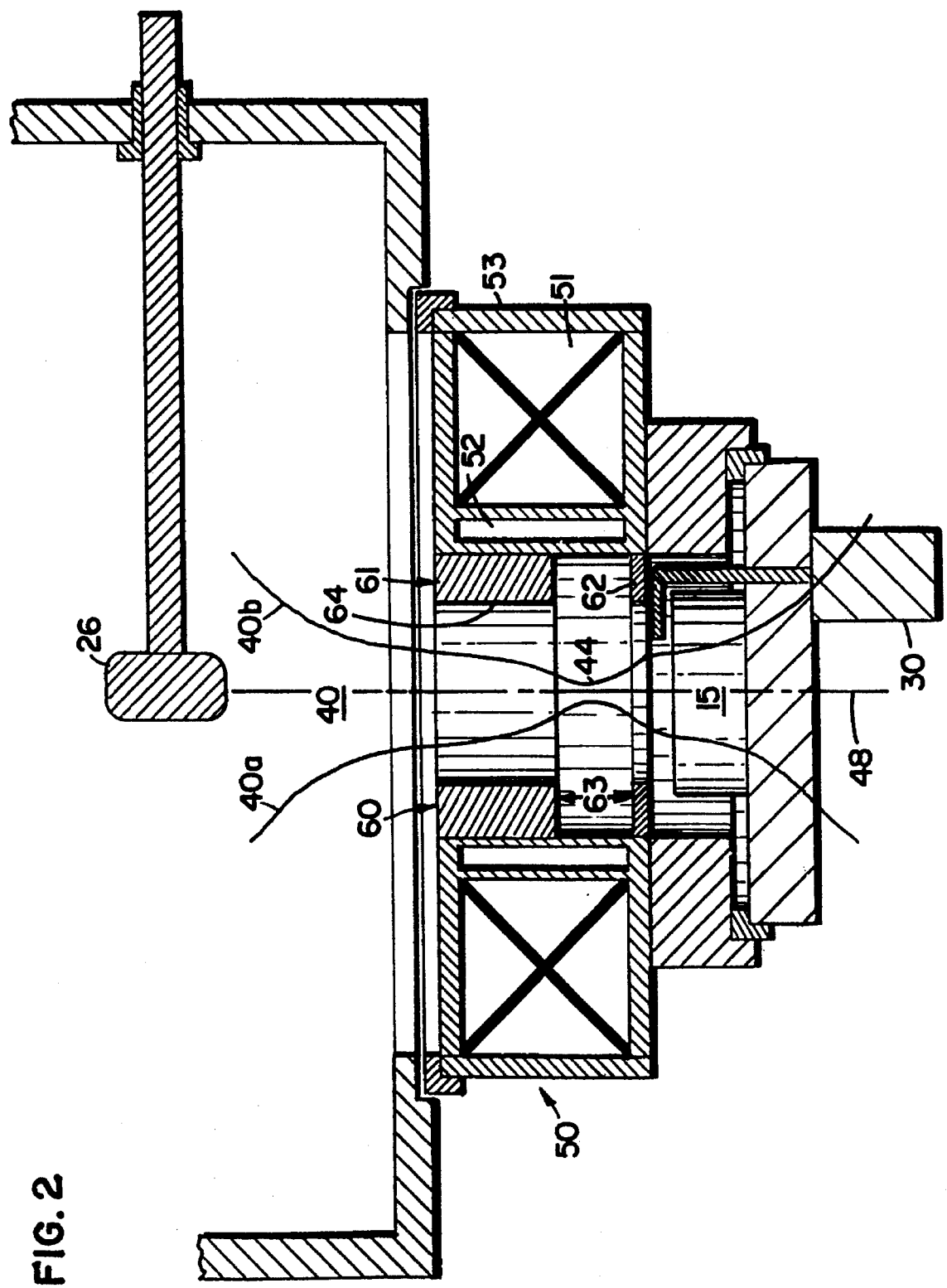
FIG. 2 is an enlarged sectional view illustrating a first embodiment of the plasma enhancement apparatus of FIG. 1 together with the immediately adjacent deposition chamber structure.

Referring to FIG. 2, a preferred embodiment of the plasma enhancement apparatus 50 includes a magnet coil 51 and a cooling jacket 52, which are enclosed in a steel casing 53. The magnet coil 51 is operatively connected to a power supply designated generally as "magnet power" at 57 by means of signal flow paths 58a and 58b through insulated ports 59a and 59b, respectively. When the magnet power 57 is activated, current flows through the magnet coil 51 and generates electric and magnetic fields, as will be discussed further below.

The cooling jacket 52 is preferably included, but the invention is not dependent thereon and should not be limited thereby. Where the cooling jacket 52 is provided, it is operatively connected to appropriate cooling means 57 via a coolant flow path 58, which passes through an insulated port 59 in the chamber wall 10a, as shown in FIG. 1. As with the cathode, the cooling medium for the plasma enhancement apparatus is preferably water.

In a preferred embodiment, the casing 53 and its contents, namely, the magnet coil 51 and the cooling jacket 52, generally take the shape of a cylindrical shell aligned generally coaxially with the cathode axis, and having an coil inner radius $R_2$ as shown in FIG. 9, as well as FIG. 2. However, it cannot be overemphasized that the present invention is not limited by any particular shape of the plasma enhancement apparatus, and that any number of configurations may be used.

The plasma guide 50 further includes a core member 60, which has a core outer radius R2 and nests within the coil inner radius $R_2$ of the casing 53. The core member 60 defines an aperture 64 having a radius of 25.4 mm, through which the majority of the plasma 40 travels. The core member may be constructed from a variety of materials, magnetic and non-magnetic, depending on the application. The axial thickness of the plasma guide 50 is preferably 75.0 mm. Again, those skilled in the art will recognize that the invention is not limited to round cores or cores defining round apertures, but that various configurations will work and may be desirable for particular applications.

According to a preferred embodiment, the core member 60 includes a first cylindrical shell 61, having an approximate axial thickness of 35 mm, and a second cylindrical shell 62, having an approximate thickness of 5 mm. The first and second cylindrical shells 61 and 62 are separated by ceramic spacers (not shown) to cooperatively define a cylindrical shell void 63, having an approximate axial thickness of 25 mm, therebetween. In this particular embodiment, the core 60, comprising the shells 61 and 62 and the spacers (not shown), are secured relative to the magnet coil 51 by friction fit. Those skilled in the art will recognize that other means are available to accomplish this task, and that the coil inner radius can be larger than the core outer radius.

Those skilled in the art will recognize that the present invention would also function with a permanent magnet in place of the electromagnet 51. In fact, a permanent magnet may be desirable once an optimal field strength has been determined because the use of a permanent magnet eliminates a parameter from the process that would otherwise require control. Moreover, a permanent magnet configured in the shape of the core could be substituted in place of the electromagnet and the core.

Figure 2A:
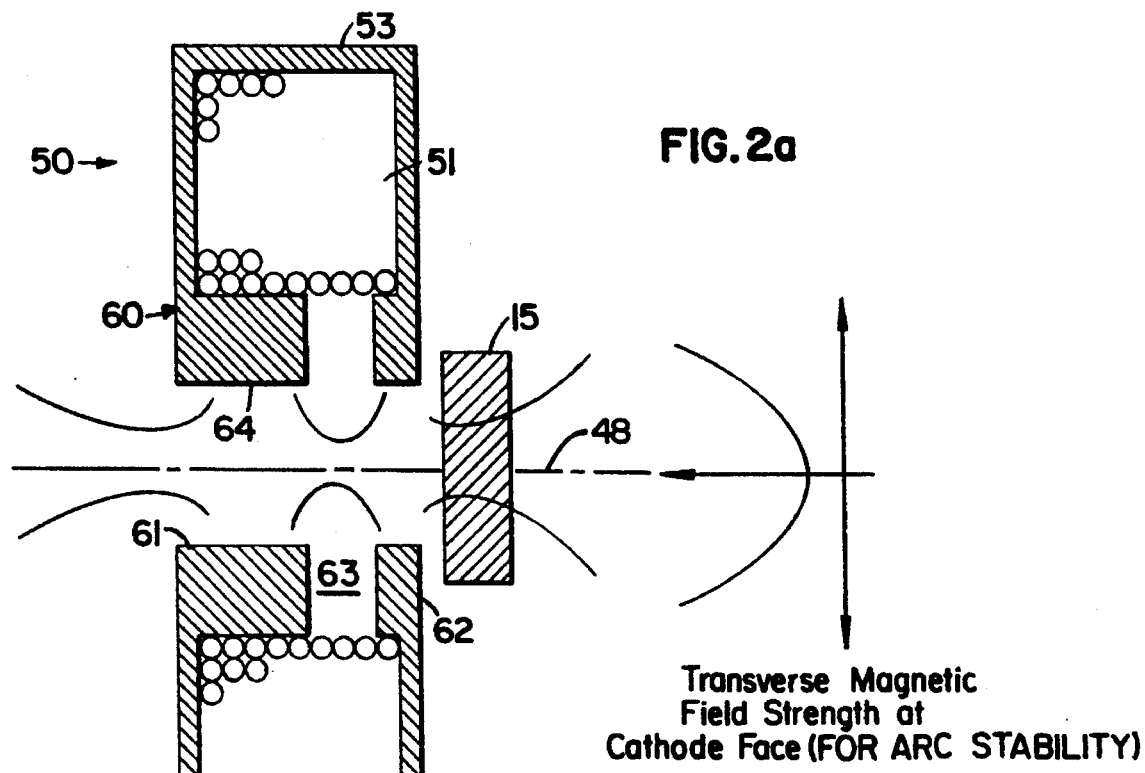
FIG. 2a is a digrammatic view of the magnetic fields generated by a current passing through the magnet coil of the plasma enhancement apparatus of FIG. 2.

Currents of up to 70 Amps through the magnet coil produced a maximum field strength of 1500 Gauss measured along the magnet coil axis. The resulting magnetic fields are shown in FIG. 2a, and the net emitted plasma stream 40 is shown in FIG. 2. The plasma 40 tends to converge in a "focus zone" 44, which is bordered by the void 63 and extends a distance along the axis 48 of the plasma enhancement apparatus 50. The effects of this convergence or focusing of the plasma stream 40 are explained in greater detail below.

Experimental Results for First Core and Titanium Cathode

Using a titanium cathode in a nitrogen atmosphere, an apparatus configured according to the preferred embodiment described above (and illustrated in FIG. 2) was operated within a Langmuir probe experimental system. The substrate was coaxially positioned relative to the face of the titanium cathode, and at a distance of 375 mm. The substrate, which was 12.7 mm in diameter, was recessed into a ceramic fixture. A grounded shield 1.2 mm thick with an aperture of 11.87 mm was placed 1.0 mm in front of the substrate.

Plasma emission was monitored through an observation tube aimed to intersect the symmetry axis 375 mm in front of the cathode. Light from the emission was transmitted through a quartz window, through a quartz fiber optic cable to the input slit of a 0.5 m Ebert-type Jarrel-Ash scanning monochrometer. The monochrometer was sensitive in the range 230–990 nm with a resolution of less than 0.1 nm, and the acceptance angle was 4°. Deposition rates on the substrate were determined using a microbalance with a repeatability of 20 mg. The average surface roughness was measured with a Dektak profilometer.

The current was initially set to create a magnetic field strength of 890 Gauss, the nitrogen pressure at 20 mTorr, the cathode current at 40 amperes, and the substrate bias at −80 volts. For the conventional arc experiments the plasma guide was removed and the cathode to substrate distance was 300 mm (the difference being the length of the plasma guide 50).

Figure 4:
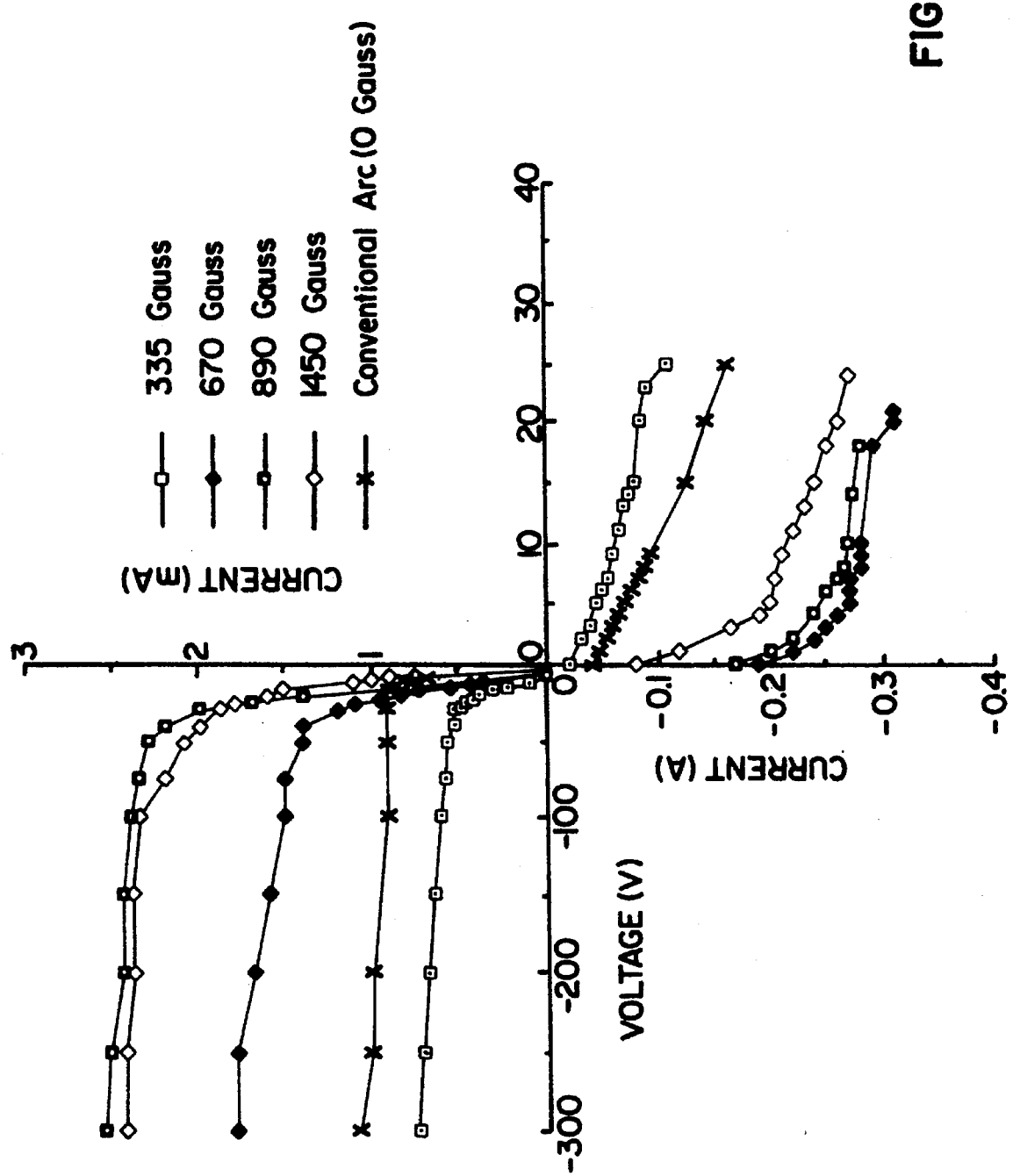
FIG. 4 is an experimental results graph of substrate current as a function of voltage across the substrate for a variety of Gauss settings for the plasma enhancement apparatus shown in FIG. 2.

Substrate current was measured as a function of applied voltage across the substrate, and as a function of magnetic field strength, and the results are shown in FIG. 4. A voltage-current curve for the conventional arc under similar conditions is also shown for reference. In FIG. 4, positive ions collected by a negative voltage are shown as a positive current and electrons collected by a positive voltage are shown as a negative current. It can be seen that the positive ion current saturates at negative voltage. The saturated ion current increases with increasing magnetic field strength at a rate that is nearly linear until a magnetic field strength of approximately 890 Gauss. Above 890 Gauss, the saturated ion current stays approximately the same. Those skilled in the art will recognize that the experimental results shown in FIG. 4 indicate that use of the plasma enhancement apparatus generates more plasma and at higher energy levels, as discussed further below.

The saturated current collected at a negative bias is primarily due to the flux of titanium and nitrogen ions entering the sheath separating the plasma from the substrate. The application of a magnetic field in a plasma optics system can have a significant effect on ion flux levels, as has been previously shown in the art. The increase in ion flux is a result of plasma focusing and the creation of additional ions through electron impact ionization. The motion and density of electrons in the magnetic field greatly increases the probability of electron particle collisions. As recognized by those skilled in the art, the probability of electron molecule inelastic collisions is proportional to the square of the magnetic field strength. If these collisions are energetic enough, excitation, dissociation of molecular species, and ionization can occur.

Electron energy was estimated from the positive current in the negative potential region before ion saturation using a method known in the art, and the electron temperatures are listed below in Table A.

TABLE A

| Magnetic Field (Gauss) | kTe (eV) | n ($\times 10^{10}$ cm$^{-3}$) | −Vf (V) |
|---|---|---|---|
| 0 | 2.5 ± 1.5 | | 1.0 ± 0.4 |
| 335 | 6.0 ± 1.5 | .80 ± .15 | 5.8 ± 0.4 |
| 670 | 10.0 ± 1.5 | 1.01 ± .26 | 8.9 ± 0.4 |
| 890 | 12.0 ± 1.5 | 1.48 ± .32 | 5.5 ± 0.4 |
| 1450 | 25.0 ± 2.0 | 1.66 ± .32 | 2.5 ± 0.4 |

The results show the electron temperature increasing nearly linearly with magnetic field strength to a maximum of 25 eV at 1450 Gauss. Listed below in Table B are the ionization and dissociation threshold energies for the plasma species present in this experiment.

TABLE B

| Species | Ionization Threshold (eV) |
|---|---|
| N2+ | 15.6 |
| Ti+ | 6.8 |
| N+ | 14.6 |
|  | Dissociation Energy (eV) |
| N | 9.9 |

These results indicate that electrons at higher magnetic field strengths are more than energetic enough to dissociate and ionize other species. The electron temperatures calculated here are for electrons in the vicinity of the substrate traveling perpendicular to the substrate. Electrons in the plasma guide closer to the cathode probably have much higher temperatures. This is indicated by the intensity of the plasma emission coming from this area.

Table A also lists the plasma density n, and the floating potential vf as a function of magnetic field strength. The plasma density was calculated from the electron temperature kTe, the saturated ion current, and the average charge per ion. The floating potential was measured directly, and the plasma potential can be roughly estimated from the saturation point of the negative current curves, as will be recognized by those skilled in the art.

Figure 5A:
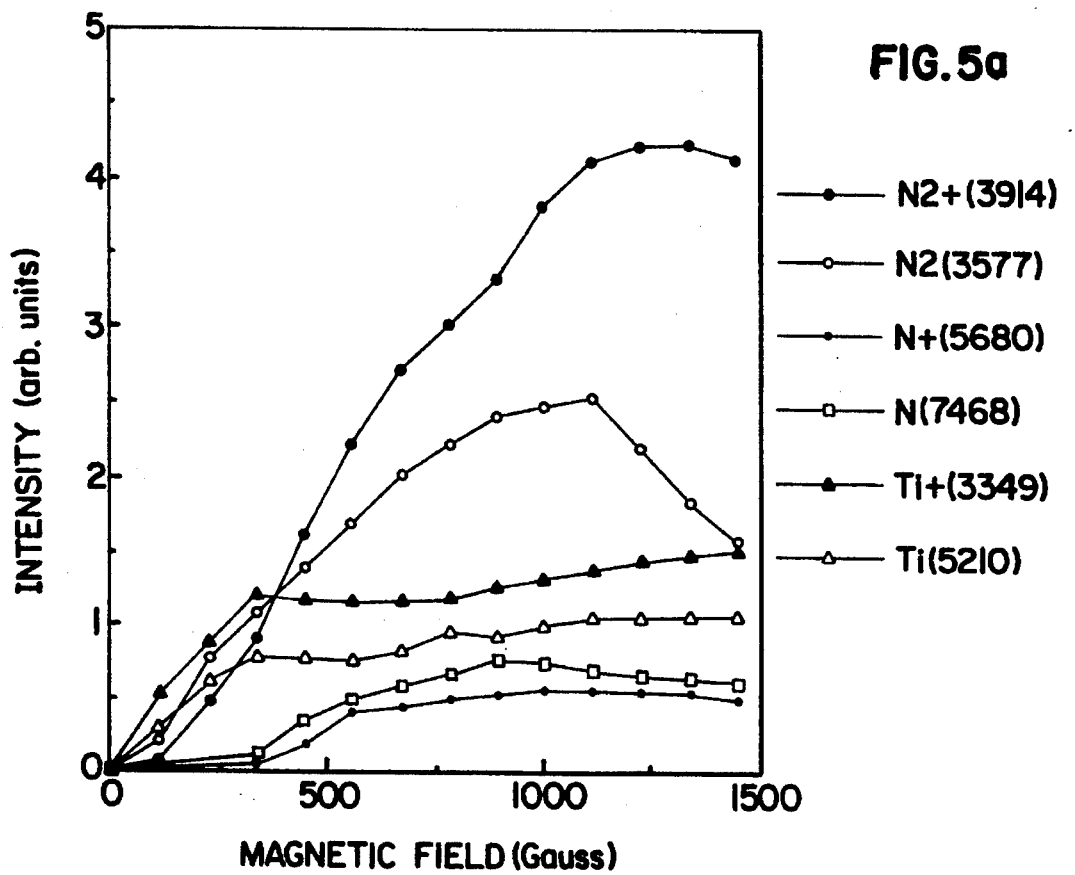
FIG. 5a is an experimental results graph of intensity for the various nitrogen and titanium atoms and ions present in the deposition chamber as a function of magnetic field strength generated by use of the plasma enhancement apparatus shown in FIG. 2.
Figure 5B:
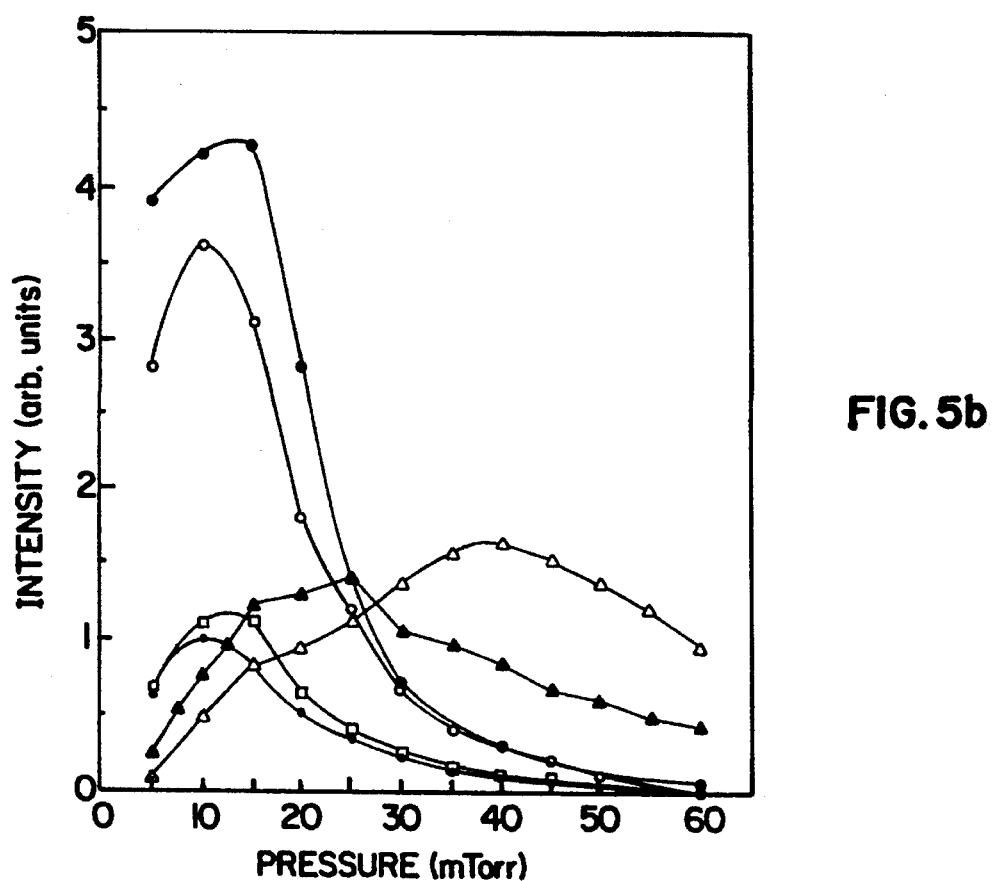
FIG. 5b is an experimental results graph of intensity for the various nitrogen and titanium atoms and ions present in the deposition chamber employing the plasma enhancement apparatus shown in FIG. 2, as a function of pressure within the deposition chamber.

Emission spectrometry was used to detect and identify species present in the plasma over the wavelength range 230–900 nm. The intensity of light of a particular wavelength is a reliable indicator of the presence and intensity of a particular atom or ion. Plasma emission was monitored at the same distance as the Langmuir probe, with the Langmuir probe removed. Measurements were made as a function of magnetic field strength and nitrogen pressure. The results, which are presented graphically in FIGS. 5a and 5b, show the presence of ionized and excited titanium and significant amounts of ionized and excited molecular and atomic nitrogen. This is in contrast to the conventional arc process where molecular nitrogen emission intensity is relatively weak and atomic nitrogen emission is not present at all.

Emission from decaying Ti, Ti+, $N_2$, $N_2$+, N, and N+ species was observed. Emission from $Ti^{2+}$ and $N^2$+ lines were not identified. FIG. 5a shows the variation in emission intensity with magnetic field strength for the strongest Ti, Ti+, $N_2$, $N_2$+, N and N+ lines. All lines are strongly influenced by magnetic field strength. In FIG. 5a, it can be seen that there is an especially strong association between the intensity of emission of nitrogen species and magnetic field strength. The presence of $N_2$, $N_2$+, N and N+ emissions which increase nearly linearly with magnetic field strength indicates that electron impact excitation, dissociation, and ionization of nitrogen is occurring. The excitation thresholds for these emissions are 11.1, 18.7, 12.0 and 20.7 eV respectively. Electron temperature estimates made from the Langmuir probe experiments show that electron temperatures exceeding these excitation thresholds are reached.

All nitrogen emissions including $N_2$+, $N_2$, N+ and N peak in the magnetic field strength range of 900 to 1200 Gauss. The rapid decline in $N_2$ emission intensity and saturation of $N_2$+ emission intensity may be the result of nearly complete dissociation and ionization of $N_2$. These emission features also correlate with the behavior of the ion and electron saturation currents described in the Langmuir probe experiments at the same conditions. The saturation currents increase linearly with increasing magnetic field strength and then peak in the same magnetic field strength range of 900 to 1200 Gauss.

The Ti+, and Ti emission lines as shown in FIG. 5a, increase rapidly up to 335 Gauss, above which the emissions level off. From 0 to 335 Gauss, the steep, nearly linear increase in the titanium emissions is probably due to plasma focusing and electron impact ionization. The abrupt saturation of the titanium emission lines at 335 Gauss correlates to an electron temperature of approximately 6 eV (based on previously reported results) which is close to the ionization threshold of titanium. The abrupt saturation of the titanium emission lines may be the result of nearly complete ionization of titanium. The presence of the excited titanium emission line which imitates the behavior of the ionized titanium emission line at a lower intensity is probably due to three body electron recombination as described below.

FIG. 5b shows the variation in emission intensity with nitrogen pressure at a constant magnetic field strength of 890 Gauss for the same emission lines as in FIG. 5a. The characteristic features of this graph are similar to those done with the conventional arc (0 magnetic field strength). The most notable difference is the high intensity of the nitrogen emission lines. Between 0 and 15 mTorr, the increases in the nitrogen and titanium emission may be attributable to charge exchange reactions of the type $Ti^{n+}+N_2 \rightarrow Ti^{(n-1)+}+N_2+$.

It is believed that the rapid decrease in the intensity of the $N_2$+ emission above 15 mTorr occurs because the initially high energy of $Ti^{2+}$ species is lost in collisions with nitrogen and falls below the 14.0 eV threshold energy needed for this reaction to occur. The Ti+ to Ti reaction does not occur because it requires an excessively high ion threshold energy of 32.3 eV.

In the region above 15 mTorr, the behavior of the Ti+ and Ti emission can be attributed to the three body reaction $Ti^{n+}+e=N_2 \rightarrow Ti^{(n-1)+}+N_2$. The probability of this reaction increases with increasing nitrogen concentration. This is shown in FIG. 5b by the decline of the Ti+ emission accompanied by a rise in the Ti emission and the decline of both species above 40 mTorr.

These results and observations indicate that in the magnetic field of the enhanced arc apparatus, electron particle collisions result in significant excitation, dissociation, and ionization of titanium and nitrogen species. In addition to the inelastic electron-particle collisions, charge exchange and three body reactions typical of the conventional arc are still occurring. Based on the results from the Langmuir probe and the emission spectrometry and the logical interpretations thereof, it appears that the number density of nitrogen ions to titanium ions and the resulting contribution of nitrogen ions to the ion flux on a substrate is significant. This is in contrast to the conventional arc process where nitrogen ions contribute a very small amount to the current on a substrate.

Finally, a direct comparison of the emission intensity of the $N_2$+, $N_2$, Ti+, and Ti lines studied here showed that emissions in the conventional arc system were only 2.3, 1.3, 25 and 11 percent respectively, of the emissions in the enhanced arc system under the same operating conditions. This supports the conclusion that significant enhancement of titanium and nitrogen excitation and ionization is occurring in the enhanced arc system.

The vapor being deposited on the substrate was found to be 100 percent ionized using a recognized ion exclusion method. The ionized fraction of the vapor impinging on the substrate was determined by comparing the deposition rate while excluding ions, to the deposition rate when ion deposition was allowed. Although the graphs of FIGS. 5a and 5b indicate that some amount of nitrogen and titanium atoms are present during the deposition process, it is believed that this is not the case at either the convergence zone or the substrate. Rather, it appears that some limited "recombination" of particles occurs in transit between the convergence zone of the plasma stream and the substrate.

Ion deposition was done at a magnetic field strength of 890 Gauss for 30 minutes. Ion exclusion deposition was done at the same parameters, except a screen with a transparency of 0.903 was placed 1 cm in front of the substrate and biased at −100 V to collect ions. A Debye sheath surrounding the wires enhances the effective ion stopping power of the screen. The substrate was also biased at +30 V to repel any ions that made it through the screen.

The result was no gain in mass when ions were excluded from deposition. No measurable amount of neutral macroparticle flux was included in film deposition. Ionization percentages of 68 to 83 percent in the conventional arc process reflect primarily the deposition of macroparticles. No mass gain under ion exclusion deposition conditions supports the conclusion that 100 percent of the vapor is ionized in the enhanced arc process.

The average charge per ion was found to be 2.08±.28e. The average charge per ion was determined from the deposition rate and the collected ion charge on a substrate. The deposition rate was measured in mass gained per second per area on a substrate clamped in a fixture exposing a deposition area of 3.23 $cm^2$. Due to gas scattering, the area increased to approximately 3.53 $cm^2$ at 20 mTorr.

The collected ion charge was determined using a value of ion current density obtained from the Langmuir probe system for the same parameters used in deposition. The substrate temperature was less than 220° C. throughout deposition. The atomic ratio of nitrogen to titanium in the film was determined using XPS.

The average charge per ion was determined assuming that the nitrogen mass contribution to the film was from ionized molecular nitrogen. (i.e., the ion flux producing the film includes nitrogen ions as well as titanium ions.) This is in contrast to the conventional arc process where the average charge per ion determined assuming the nitrogen ion contribution is negligible. In the present experiment, if the nitrogen ion contribution is discounted, the calculated average charge per ion increases by almost 300 percent. The nitrogen flux is also assumed to come from ionized molecular nitrogen. If the ionized nitrogen flux is composed of 10 percent ionized atomic nitrogen (a reasonable estimate considering emission spectrometry results) the average charge per ion would be reduced to 1.79e.

The average charge per arriving atom is also a product of the sticking coefficient of the ions to the substrate. A sticking coefficient of 0.9±0.1 was used, which is for low energy metal atoms impinging surfaces to which they have a high affinity. An acceleration of the ions and the presence of impinging nitrogen ions in the enhanced arc system may lower the sticking coefficient somewhat. The error in the average charge per ion primarily reflects uncertainties in the sticking coefficient and in the stoichiometry.

Using conventional arc deposition techniques at 20 mTorr, the average charge per ion is approximately 1.6e. The 2.08e achieved with the present invention reflects higher ionization levels and percentages in the enhanced arc system. This value was also found at nearly twice the distance and half the cathode current used in determining the conventional arc data. At similar parameters the average charge per ion calculated here probably would increase further.

Figure 6:
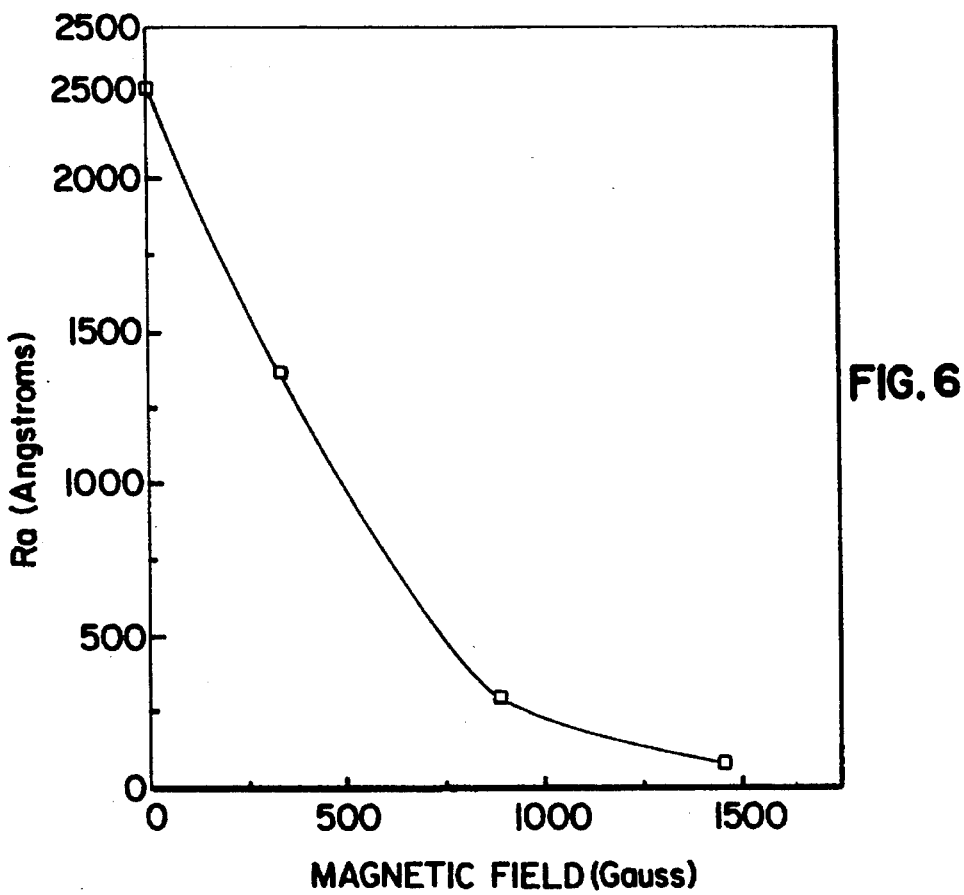
FIG. 6 is an experimental results graph of surface roughness of a vapor deposited substrate film coating as a function of magnetic field strength generated by use of the plasma enhancement apparatus shown in FIG. 2.

FIG. 6 shows the variation in surface roughness of the coating deposited on the substrate as a function of magnetic field strength. The zero magnetic field strength value was obtained with the conventional arc system (i.e., no plasma enhancement apparatus). High speed steel substrates (polished to approximately 150 Angstrom finish) were placed 225 mm in front of the cathope, and films were deposited for 15 minutes. The average surface roughness was measured before and after film deposition and the difference plotted in FIG. 6.

It can be seen in FIG. 6 that the average surface roughness decreases rapidly down to a minimum of 80 Angstroms at 1450 Gauss magnetic field strength. SEM analysis of the surface for the film deposited at 1450 Gauss showed nearly no macroparticles. Similarly, the film deposited at 890 Gauss also showed very few macroparticles. The small increases in average surface roughness of the samples deposited at 890 and 1450 Gauss, which can be seen as small ripples on a micrograph, are due primarily to etching from ion bombardment, which is indicative of the Hall acceleration of the ions in the magnetic field.

The reduction and elimination of macroparticles in the enhanced arc system can be attributed to one or more of four effects. One effect is due to geometry and has been previously recognized by those skilled in the art. Macroparticles leaving the cathode in the enhanced arc system at less than 55° from the cathode surface will collide with the plasma guide, and a large percentage of the macroparticles typically leave the cathode at angles of less than 30°. While such "shielding" of macroparticles is inherent in the structure of the present invention, the effectiveness of the present invention is attributed primarily to the elimination of macroparticles by focusing the plasma stream; the difference being that the present invention, in effect, "recycles" the macroparticles.

A second effect is due to the modification of the arc discharge in the magnetic field enhanced by the present invention. The plasma enhancement apparatus creates magnetic fields that facilitate rapid movement of the arc across the cathode surface, resulting in a distinct reduction in the amount of melted area around the arc craters on the cathode, which are typically a source of macroparticles. Splitting of the arc into multiple cathode spots also occurs in the enhanced magnetic field, resulting in lower current densities and less melting of the cathode surface. SEM analysis of the surface of the cathode used in the enhanced arc system showed a distinct reduction in the amount of melted area and smaller crater sizes on average in relation to a cathode used in the conventional arc system.

A third effect is a result of cathode "poisoning," as fewer and smaller macroparticles are produced from a cathode having a nitride surface. The production and confinement of large numbers of nitrogen ions in the vicinity of the cathode in the enhanced arc system contributes to the nitriding of the cathode surface. This is shown by an increase in the yellowing of the cathode after having been used in the enhanced arc system as compared to a cathode subjected to conventional arc techniques.

A fourth effect is a result of the evaporation of macroparticles by collisions with electrons. The dense energetic electron conditions in the convergence zone generated by the plasma enhancement apparatus are a likely explanation for the large reduction in macroparticles with increasing magnetic field strength.

The enhanced plasma optics system of the prevent invention increases the ionization and energy of the flux impinging TiN films during deposition. Inelastic collisions with energetic electrons in the strong confined magnetic field of the apparatus results in an increase in the excited and ionized species density. Dissociation and ionization of nitrogen and the resulting contribution of nitrogen ions to the plasma flux is especially apparent. The average charge per ion at the substrate is increased over the conventional arc case to approximately 2.1e. The ionized fraction of the vapor is also increased to 100 percent in the convergence zone and proximate the substrate; the neutral vapor and macroparticle contribution to mass gained at the substrate was measured to be zero. Accordingly, deposited films are nearly free of macroparticles.

Alternative Plasma Enhancement Apparatus

FIG. 3 shows an alternative embodiment of a plasma guide 50' according to the principles of the present invention. The plasma enhancement apparatus 50' of FIG. 3 is similar in detail to that of FIG. 2 with the substitution of core 80 for core 60 which is symmetrically disposed about the axis 48' of the plasma enhancement apparatus 50'. The magnet coil 51' has an outer coil radius R3' of 45 mm and an axial thickness of 100 mm. Core 80 includes a plurality of cylindrical shells 81a–81e, each having an approximate axial thickness of 5.0 mm. Each of the cylindrical shells 81a–81e rests on a ceramic spacer (not shown) to define cylindrical shell voids 82a–82e, each having an approximate axial thickness of 12.0 mm. In this particular embodiment, the core 80, comprising the shells 81a–81e and the spacers (not shown), are secured by bolts (not shown) to the magnet coil 51.

Figure 3A:
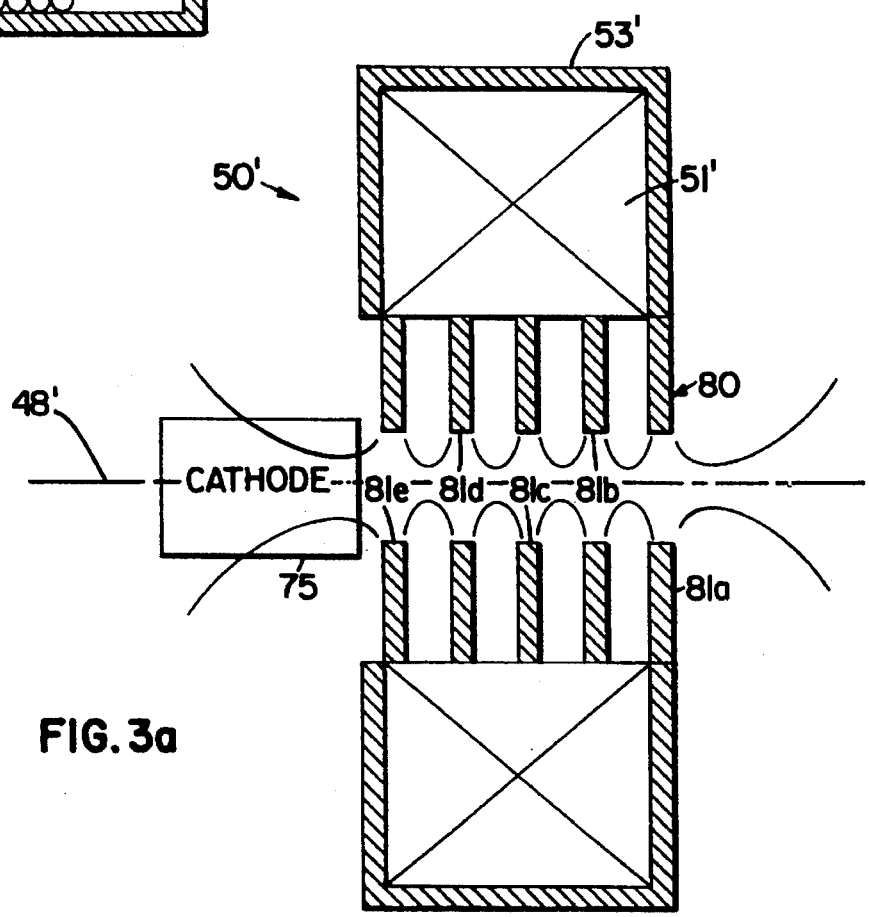
FIG. 3a is a digrammatic view of the magnetic fields generated by a current passing through the magnet coil of the plasma enhancement apparatus of FIG. 3.

A current through the magnet coil 51 generates the magnetic fields shown in FIG. 3a, and the net emitted plasma stream 40' is shown in FIG. 3. The operative effect of the core 80 is to create a magnetic field with a "longer" axial focus zone 44', through which the plasma stream 40' passes. The "path lines" 40a' and 40b', defining the general path of the plasma 40, represent the "effective magnetic field" generated by the core 80.

In addition to enhancing the evaporation, transportation, and deposition of the plasma, the present invention facilitates the selection and substitution of varied core configurations in order to create magnetic fields of varied magnitude, shape, and axial focal length, accomodating various deposition applications and the use of widely differing source materials. Just as the first core 60 is deemed suitable for use in conjunction with the titanium cathode 15, the second core 80 is deemed well suited for use in conjunction with a graphite cathode 75, as explained below. In fact, use of the second core 80 in the manner set forth below produces diamond-like coating films that are virtually free of hydrocarbons.

Experimental Results for Second Core and Graphite Cathode

Using a graphite cathode in a controlled partial pressure hydrogen atmosphere, experiments were conducted with an apparatus configured according to the preferred embodiment described above (and illustrated in FIG. 3). The high purity graphite cathode had the following characteristics:

Grade: Poco SFG-2

Density: 1.8 gms/cm$^3$

Pore Size: 0.2 um

Particle Size: 1 um

Purity: 5 ppm.

The cathode 75 was arranged coaxially in relation to the magnet coil 51, which is 90 mm in diameter and 100 mm thick (measured axially). The DC current supplied to the magnet coil 51 was controlled for producing an axial magnetic field with a strength varying in magnitude from 0 to 1000 Gauss. The shape and the fringing effect of the lines of force can be optimized by the magnetic core pieces 81a–81e positioned inside the plasma enhancement apparatus 50'. The working vacuum during arc evaporation was around 10-6 Torr. Hydrogen and argon gases were metered by conventional Tylan mass flow controllers, the pressure measurement was performed by means of a MKS baratron transducer, and the substrate temperature was determined using an infrared optical pyrometer.

The experiments were conducted with substrates made of polished high speed steel, WC, and silicon. After having been thoroughly degreased in organic cleaning the samples were pressed onto a water cooled stainless steel substrate holder. Before the coating phase, the substrate(s) were subjected to an additional cleaning by igniting a Hydrogen/Argon glow discharge at reduced partial pressure of about 10 to 100 mTorr at a bias voltage of −1000 V for 10 minutes. This plasma etching phase was found to be important for conditioning the substrate surface prior to deposition and for improving the adhesion of the carbon layers. It is believed that the preparatory high energy bombardment of the substrate impregnated the substrate with carbon species, and thus, solved previously encountered problems in getting the carbon film to nucleate on the substrate The deposition conditions used with conventional and modified arc source for carrying out the carbon films are summarized in Table C.

TABLE C

Summary of Graphite Arc Evaporation Experimental Conditions

| | Modified Arc Source | | Conventional Arc Source |
|---|---|---|---|
| | Sample A | Sample B | Sample C |
| Substrate | HSS | Silicon | WC |
| Evaporation Current Ic (A) | 50 | 50 | 50 |
| Substrate Voltage Us (V) | −50 | −50 | −150 |
| Magnetic Field B (Gauss) | 500 | 500 | 0 |
| Gas Used | Ar | $H_2$ | None |
| Coating Pressure | 25 mTorr | 25 mTorr | 10 −6 Torr |
| Film Thickness | 2.5 um | 1 uM | 0.5 um |

The hardness of the coatings was measured by using a Vickers microhardness tester. The adhesion strength of the films deposited on the different substrates was tested with a VTT scratch tester. A Macbeth colorimeter was used to express the optical reflectance behavior of the deposited carbon lawyers. The morphology of the carbon layers was observed by using a Scanning Electron Microscope and their surface roughnesses were quantified by a Dektak II A profilometer. The structure and the chemical bonding of the films were analyzed by Raman and Fourier Transforms Infrared spectroscopy.

In order to define the effect involved in evaporating graphite cathodes, a first attempt was made to deposit carbon films using conventional arc process conditions, similar to those normally used with a titanium cathode. The arc current intensity was set to 50 A and the substrate DC bias voltage during the coating phase was established to approximately −150 V for keeping constant the sample temperature at 150° C. No gas support was used during the course of the 30 minutes experimental cycle. A substrate current of 2.5 A, as well as a voltage drop Uc across the discharge space of 20 V, were measured.

As expected in view of previous efforts of this nature, the carbon arc discharge exhibited a "monospot" at the cathode surface. This quasi-stationary spot moved very slowly along the edge of the cathode, with a velocity of less than 1 cm per second. Furthermore, the glow emitted from the discharge was very bright and the heat transfer to the substrate was significant. The plasma flux generated by carbon arc evaporation exhibited a high ionization degree reaching a maximum value of 70 percent. This agreed with previously documented results, which show a correlation between the degree of ionization and the cathode material boiling temperature (which is 4500k for carbon material). Those skilled in the art will recognize that carbon demonstrates a negative resistivity for temperature below 1000° K, which might explain the slow arc motion at the cathode surface and its tendency to preferentially locate where the carbon resistance is the lowest. This feature seems to lead to the observed arc instability and short discharge lifetime, which require frequent re-triggering of the cathode. The above-mentioned effect also tends to generate a large number of incandescent carbon particles ejected simultaneously with the ionized plasma stream. As was expected, the HSS substrate held at a 150 mm distance from the carbon source exhibited a powdery graphite coating having a very poor adhesion. SEM observation of the film surface, revealed substantial defects, which are due to the unstable conditions of the conventional arc evaporation, leading to macroparticle ejections and low quality deposition.

When the magnetic field, induced by the magnet coil 51 of the plasma enhancement apparatus 50, was activated, the random trajectory of the cathode arc spot was no longer displayed. The spot seems to be steered to the surface center of the carbon cathode, where the lines of force of the magnetic field are substantially perpendicular to the cathode, and its axial component Bz is maximum. However, under a residual vacuum condition of 10-6 mTorr, the arc discharge was still unstable and the cathodic spot was extinguished by the magnetic field when its value exceeded several hundred Gauss. To sustain a very stable evaporation, a gas support partial pressure of argon or hydrogen with a minimum value of 5mTorr must be set during the process. The arc discharge obtained in this stable condition displayed an arc column contraction and a bright gas glow discharge spot located in front of the cathode. These effects lead to an increase of the cathode temperature resulting in the improvement of the discharge lifetime and the reduction of the observed emission of incandescent carbon macroparticles. Furthermore, when the magnetic field is applied, augmentation in the voltage drop Uc across the discharge space to 40 Volts was measured for a 50 A arc current intensity.

Figure 7:
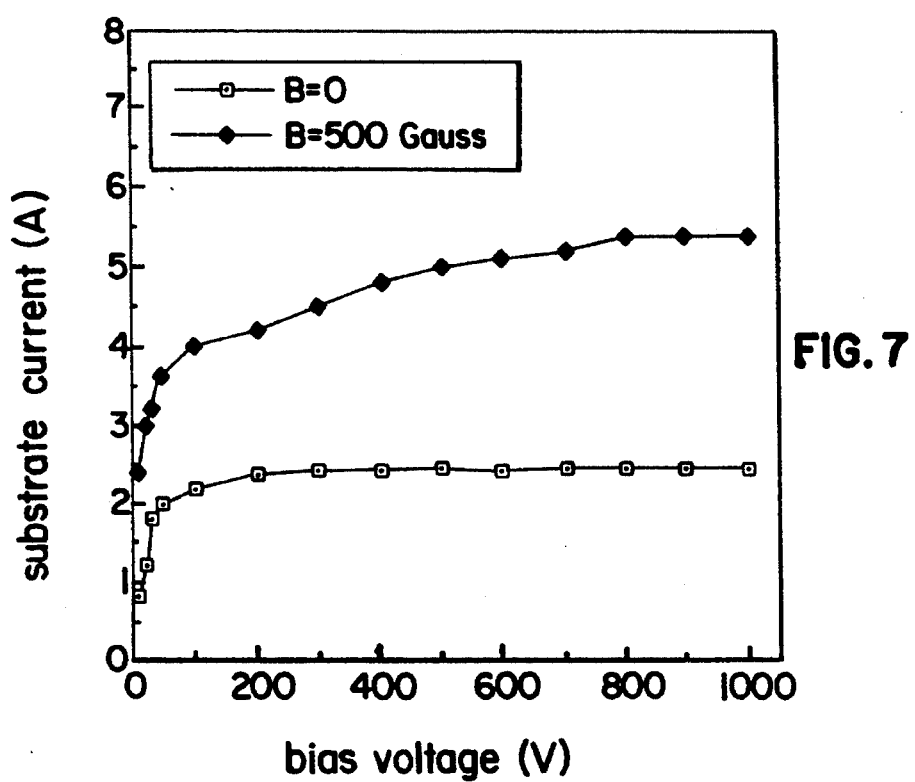
FIG. 7 is an experimental results graph of substrate current as a function of voltage across the substrate for magnetic fields of 0 and 500 Gauss generated by use of the plasma enhancement apparatus shown in FIG. 3.

FIG. 7 shows the magnetic field influence induced by the magnet coil 51 on the total ion current collected as the plasma exited the plasma enhancement apparatus 50 as a function of the substrate bias voltage applied. The saturation ion current measured by setting a 500 Gauss magnetic field is much higher than that obtained with a conventional arc discharge, when no external magnetic field is used. The saturation current measured with a 80 mm diameter probe at the plasma exit point is 5 A, corresponding to two times the total ion current collected with conventional arc discharge.

Figure 8:
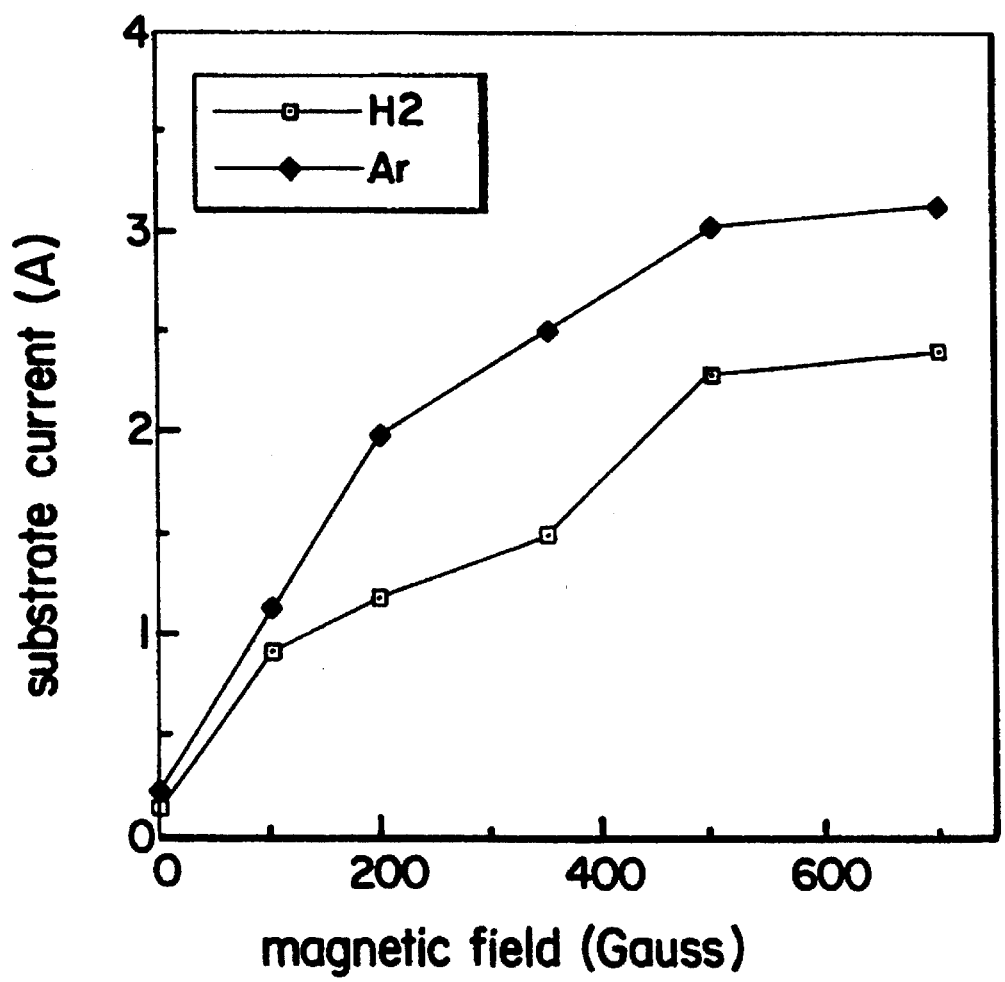
FIG. 8 is an experimental results graph of substrate current as a function of magnetic field strength generated by use of the plasma enhancement apparatus shown in FIG. 3 for environments of hydrogen and argon.

The curves presented in FIG. 8 demonstrate the influence of the magnetic field strength versus the saturation ion current collected by a −150 V biased probe, when the arc discharge is established at 25 mTorr partial pressure of argon or hydrogen gas. As illustrated in FIG. 8, the increase of the magnetic field leads to a rise of the total saturation current collected. Both measurements performed with argon or hydrogen gas display saturation effect for a magnetic field value of around 500 Gauss. The results illustrate the result of focusing the plasma with the magnetic field. The axial component Bz of the magnetic field with the azimuthal Hall current J flowing through the plasma, generate a radial force Fr= J.Bz (Lorrentz force) focusing the plasma stream along the plasma guide. This effect results in magnetization of the electrons involving an increase of the electron-molecule and ion-molecule interaction probability and leading to further excitation and ionization of the plasma flux species. An additional consequence of the magnetic field on the plasma stream is an increase in the average ion energy, as measured by a multi-electrode electrostatic probe in vacuum condition as a function of the magnetic field strength. This effect is the result of radial component Br of the field which produces an acceleration force Fz=J.Br on the plasma stream leading to higher energy of the carbon ions. These different experimental observations and results suggest that the enhanced arc apparatus improves the carbon arc discharge by increasing the total ion flux collected by the substrate and controlling the ion energy of the plasma stream.

The hardness of the carbon films deposited at a bias voltage of −50 V, on high speed steel (sample A) and silicon (sample B) substrates was measured by using a diamond microhardness technique and applying loading forces in the range of 10gf to 400gf. In this test the film thickness was measured as 2.5 um for sample A and 1 um for sample B. The indent diagonal length was confirmed by SEM observation and the film hardnesses were calculated using the relation HV=0.1891 F/d2, which had been previously employed for determining the film hardness of a diamond-like coating. Viewing the hardness of the different films as a function of load increases from 10 gf to 400 gf, the hardness value discrepancy measured for heaviest load, between film A and B, seems to be due to the thickness difference of the films and the substrate hardness inequality. The hardness of the film B deposited on silicon measured with a 400 gf exhibits a value of 1100 HV greater than silicon hardness value of 800 HV. No hardness measurements for loads less than 25 gf were analyzed because the hard nature of the film leads to a too small indent size. However, average hardness of 2600 HV and 5200 HV with respectively 50 gf and 25 gf load have been measured for both samples A and B.

Using SEM surface topography analysis, the carbon films deposited by the modified arc process of this invention on high speed steel substrates are very smooth compared to conventional arc results. Fewer macroparticles (maximum diameter ≦500 A) and surface defects can be observed, and measurements taken by a Dektak II A profilometer confirm this observation, as both samples A and B had an Ra equal to 0.02 um.

Furthermore, SEM examination of the fracture cross section of the carbon film deposited on sample A exhibits a very dense and amorphous structure without columnar growth. The amorphous film uniformly follows the substrate surface and displays a very good adhesion level. No adhesive failure was observed at the film substrate interface.

In order to check the adhesion level of the test films, the adhesion strength was measured by scratch test method. For film A the acoustic intensity increased until reaching the lower critical limit of adhesion at Lc=22N, while the adhesive failure of the coating at the interface is given for an upper critical load of 35N. For the Si substrate, the lowest value of the lower critical load was 15N, while a higher value of the upper critical load of 42N was measured in comparison to sample A. Furthermore, the film B exhibits a higher acoustical signal amplitude compared to film A. The results from the scratch test correlated to SEM observation of the scratch coating failures, showing that film A scratch mark exhibited more coating chipping than film B. Because of the different natures of the substrates and the film thickness discrepancy, a comparative result is very difficult. Nevertheless, the critical loads measured for the various substrate, and in particular high speed steel, were promising for carbon films on such materials.

To assess the nature of the carbon film deposited by enhanced arc technique, the films obtained under hydrogen and argon partial pressure respectively on silicon and high speed steel substrate were analyzed by Raman spectroscopy. Under a 25 mTorr partial pressure of hydrogen at room temperature, the Raman spectra of a carbon filmed produced on a silicon substrate is quite typical of DLC films produced by ion beam method. It presents only a diffuse peak at wave number of 1550 per cm and a very weak peak at 1350 per cm. The G peak at 1550 per cm corresponded to the graphite crystal structure, while the D peak at 1350 per cm was characteristic of defective graphite structure or crystalline structure.

The Raman spectra of carbon films deposited onto high speed steel substrates under argon partial pressure conditions was quite odd. The main peak, the G peak, was located at a wave number of 1560 per cm while the D peak centered at 1350 per cm always very broad in conventional DLC films was in this spectra weaker than previously observed under hydrogen conditions. The relatively high energy level exhibited by the G peak lead to an asymmetry of the spectra which is characteristic of amorphous nonhydrogenated DLC films. These results seem to indicate that the structure of carbon films depends on ion energy involved during their nucleation and growth and on the level of hydrogen contained in the film. Because the carbon film structure is influenced by the state of the carbon chemical bonding, analyses have been carried out by Fourier Transforms Infrared Spectroscopy. As expected, the FTIR absorbance spectra of the film deposited on high speed steel substrates (Sample A) demonstrated the absence of C-H stretching absorption mode at the wave number of 3000 per cm which is a relatively reliable indicator that the DLC film deposited contains no hydrogen. This feature is different in the FTIR spectra observed for the DLC film deposited on sample B under hydrogen partial pressure.

The deposited films under DC bias voltage with argon and hydrogen partial pressure conditions exhibited a grey black color expressed by Macbeth color measurement as the following:

Sample A: $L^*=60.88$ $a^*=0.37$ $b^*=-1.55$
Sample B: $L^*=55.90$ $a^*=0.22$ $b^*=-0.54$ Also, reflectance curves showed that the optical reflectance did not exhibit a smooth curve, but instead oscillated between maximum and minimum, having an increasing amplitude as the wavelength increased. This phenomenon seems to result from the optically transparent nature of the arc deposited DLC films. The incident light beam is reflected by both the air/film and film/substrate interfaces. The optical effect resulting leads to generate constructive and destructive interferences, indicated by the maximum and minimum reflectance measured. This phase difference is dependent on the film thickness and the refractive index of the film and also of the substrate. If the film were optically opaque, the incident light would not reach the film/substrate interface and thus no interference would occur. However, because the films are neither totally transparent or opaque, the degree of constructive/destructive interference will depend on the amount of light absorbed by the film. The experimental results indicate that the film becomes more absorbing at low wavelength when the amplitude between maximum and minimum decreases. The films display a relative transparency in the near visible infrared range with a maximum absorbance peak at 660nm for film A and 560 nm for film B. However, the reflectance in the 400–500 nm region being slightly higher indicates the bluish dark appearance of the film in ordinary light previously exhibited by the $b^*$ color value of the films.

The plasma enhancement apparatus magnetically confines the arc discharge at the carbon cathode surface. The magnetic arc constraint leads to a better spot stability and allows a longer discharge lifetime. Optimal evaporation conditions were achieved when the axial component of the magnetic field Bz was maximum at the center of the cathode surface. The maximum magnitude of the axial field was obtained with lines of force confinement induced by optimal position of magnetic core pieces according to the embodiment shown in FIG. 3. The glow discharge spot produced in the vicinity of the cathode surface indicates an increase of excitation and ionization of the plasma flux leaving the cathode surface. This enhancement of electrons in this region is believed to contribute significantly to the acceleration of the carbon ions. The second important effect of the magnetic field occurs during the plasma stream transport, where a confinement of the plasma to a focused beam of 20 mm in diameter can be observed. The ion losses by diffusion are reduced, and the plasma flux and the ion current density collected at the plasma guide exit are considerably increased. An additional consequence of the focusing effect is the increase of the collisional process during the plasma stream transport, which is believed to be responsible for the reduction of the carbon macroparticles by evaporative phenomenon.

The plasma enhancement apparatus enhances the excitation and ionization level of the plasma and accelerating the ions to higher energy. Also, the structure and the chemical bonding of the condensated films may be controlled or affected by adjusting the condensation conditions, such as the ion current density and the ion energy. With the carbon arc evaporation technique, the level of energy for DLC films nucleation and growth is gained from the kinetic energy of the ions impinging the substrate. Also, an ideal carbon ion energy for DLC deposition must reportedly be in the range of several tens of electron volts, higher than the binding energy of the carbon atoms and lower than the threshold energy leading to crystal defect (60 ev). In addition to the carbon ion flux, the experimental results indicate that the use of argon gas results in argon ion bombardment of the film surface and sputtering of the graphitic constituent of the film.

The carbon ion energy is an important parameter because it affects the film evolution in different ways. It contributes to manage the adhesion and stress level of the film, to increase the $sp^3$ hybridized carbon and concentration of unprotonated quaternary carbon which appears to control the mechanical properties of the DLC films. It is understood that using the plasma enhancement apparatus of the present invention, the impinging carbon ion energy is easily manageable by varying the bias voltage applied to the substrate.

Additional Applications

Vapor deposition of titanium and carbon as described above constitute only two examples of the utility and application of the present invention. Those skilled in the art will recognize various additional applications and modifications in view of the foregoing disclosure. For example, the core members need not be coaxial, nor even coplanar relative to one another. In fact, certain applications may require that a series of core pieces be aligned relative to one another in such a manner to define a curved plasma stream. Additionally, one or more of the core members may be mechanically driven to "spray" a relatively narrow plasma stream across a wide area. Such an application may be desirable where a large object must be coated with a very high density coating.

Another attractive application involves the coating of inner surfaces of tubes and the like, where the penetration of the coating material into the tube is a function of the diameter of the tube. The present invention makes it possible to generate and accelerate an intense narrow beam of plasma, which will provide greater penetration into tubular structures and the like. Such a narrow beam can be generated either by increasing the thickness of the core piece or pieces nearest the exit of the plasma guide or by adjusting the aperture defined by the core piece or pieces nearest the exit of the plasma guide. On the other hand, for applications where it is desirable to distribute a fine coating over a large area, as is the case with many mass production operations, the core piece(s) nearest the end may be thinner.

For any given application, the core pieces comprising the core member can be varied in size, shape, number, and position (relative to one another, as well as the magnet) until a suitable configuration is achieved. Such "fine tuning"

capability is facilitated by the structure of the present invention. Accordingly, while the present invention has been described with reference to two particular embodiments, various alternative embodiments and design options will be apparent to those skilled in the art, and the present invention is to be limited only by the appended claims.

What is claimed is:

1. A plasma enhancement apparatus for use in combination with an electric arc vapor deposition system having a vacuum chamber, a consumable cathode source of coating material defining a cathode evaporation surface and an anode operable with the vacuum chamber, means for supporting a substrate to be coated in spaced line-of-sight relation to said cathode, said line-of-sight extending along an axis line extending between said cathode evaporation surface and said substrate, means for initiating and sustaining an electric arc between the cathode evaporation surface and said anode to create a column of plasma material projecting in line-of-sight manner along said axis line in a vacuum space extending from said cathode evaporation surface toward said substrate, comprising: field generating means mounted relative to said cathode evaporation surface and said substrate, so as to maintain said line-of-sight therebetween, for generating a magnetic field having magnetic field lines arranged around said axis line and between said cathode evaporation surface and said substrate and of a configuration whereby said field lines are constricted in at least a portion of said vacuum space; said magnetic field being further characterized by having:

a. strength and orientation relative to said cathode evaporation surface that defines the intensity and confined movement of an arc spot of said arc over said cathode evaporation surface so as to minimize the generation of macroparticles at said cathode evaporation surface and to minimize their presence in said column of plasma material projected therefrom; and b. strength and orientation that energizes electrons of said column of plasma material within at least a portion of said vacuum space, sufficiently to cause macroparticle vaporization therein, and that significantly increases the ionization, ionic charge and ionization fraction of said column of plasma material at said substrate; whereby highly ionized substantially macroparticle reduced coating material from said cathode source impinges upon said substrate.

2. The plasma enhancement apparatus as recited in claim 1, wherein that portion of said column of plasma material impinging upon said substrate is virtually macroparticle free and fully ionized.

3. The plasma enhancement apparatus as recited in claim 2, wherein said cathode source comprises titanium.

4. The plasma enhancement apparatus as recited in claim 1, wherein said cathode source comprises graphite material.

5. The plasma enhancement apparatus as recited in claim 4, wherein that portion of said column of plasma material impinging upon said substrate is virtually free of hydrogen.

6. The plasma enhancement apparatus as recited in claim 1, wherein said cathode source comprises difficult to a material with a high melting point or vaporization temperature of the order of or greater than 2000° kelvin.

7. The plasma enhancement apparatus as recited in claim 1, further including means for introducing a reactive gas into the vacuum chamber such that said reactive gas forms a portion of said column of plasma material; and wherein said magnetic field enhances and improves ionization of said reactive gas adjacent said cathode evaporation surface, thereby promoting formation of a compound layer on the cathode evaporation surface, which further minimizes generation of macroparticles at said cathode evaporation surface.

8. The plasma enhancement apparatus as recited in claim 1, wherein said field generating means comprises in part, permanent magnets.

9. The plasma enhancement apparatus as recited in claim 1, wherein said magnetic field generating means comprises electromagnets.

10. The plasma enhancement apparatus as recited in claim 9, including means for shaping said column of plasma material about said axis line ; and wherein said field generating means are generally coaxially aligned with said axis line.

11. The plasma enhancement apparatus as recited in claim 10, wherein said field generating means comprises an electromagnet with at least two core members, forming a magnetic circuit; said core members defining a gap within said magnetic circuit having an axial length, wherein said magnetic field extends across said gap and operatively engages and acts upon said column of plasma material along an axial focus zone coaxially aligned with said axis line, and having an axial length generally corresponding to the axial length of said gap.

12. The plasma enhancement apparatus as recited in claim 11, wherein said field generating means comprises means for selectably changing said core members to selectably vary the axial length of said axial focus zone to accommodate various deposition applications and the use of widely differing cathode source materials.

13. The plasma enhancement apparatus as recited in claim 1, wherein said field generating means comprises an electromagnet with at least two core members, forming a magnetic circuit; said core members defining a gap within said magnetic circuit wherein said magnetic field extends across said gap and operatively engages and acts upon said column of plasma material.

14. The plasma enhancement apparatus as recited in claim 13, wherein said core members comprise selectable core piece means, that can be selectively changed, for varying the shape and magnitude of the magnetic field across said gap.

15. The plasma enhancement apparatus as recited in claim 1, wherein said field generating means comprises means for establishing a magnetic circuit having a plurality of distinct magnetic field segments within said magnetic field and engaging said column of plasma material along its longitudinal length, said plurality of distinct magnetic field segments collectively defining a focus zone axially aligned along said axis line extending from said cathode evaporation surface to said substrate.

16. A process of enhancing electric arc vapor deposition coating of a substrate within a vacuum deposition chamber by a plasma of coating material from a consumable cathode, comprising the steps of:

a. operatively arranging an evaporation surface of a consumable cathode source of coating material in line-of-sight position relative to a substrate within a vapor deposition chamber;

b. striking and maintaining an electric arc within said vapor deposition chamber, between said cathode evaporation surface and an anode, to create a plasma of coating material from said cathode evaporation surface said electric arc forming one or more arc spots on said cathode evaporation surface;

c. directing a column of said plasma in line-of-sight manner along an axis line extending from said cathode evaporation surface toward said substrate;

d. magnetically controlling the current density and movement of said arc spot over said cathode evaporation surface to reduce formation of macroparticles and to minimize their presence in said plasma column;

e. magnetically energizing electrons in said line-of-sight plasma column sufficiently to cause macroparticle vaporization therein and to significantly increase ionization, the ionic charge and the ionization fraction of said plasma; and f. impinging said column of energized plasma onto said substrate to form a smooth, dense and virtually macroparticle free coating on said substrate.

17. The method as recited in claim 16, wherein said cathode source of coating material comprises titanium; and further comprising the step of cooperatively performing the steps of magnetically controlling the current density and movement of the arc spot and of magnetically energizing electrons said plasma column, so as to virtually completely ionize the plasma column material that impinges on the substrate.

18. The method as recited in claim 17, further including the steps of: introducing a reactive gas into the deposition chamber; and ionizing said reactive gas adjacent the cathode evaporation surface to promote formation of a compound layer on the cathode evaporation surface that inhibits macroparticle emission into the plasma column.

19. The method as recited in claim 16, wherein said cathode source of coating material comprises carbon-based material, and further comprising cooperatively performing the steps of magnetically controlling the current density and movement of the arc spot and magnetically energizing said plasma column, so that a carbon stream virtually free of hydrogen impinges on said substrate; thereby forming a diamond-like coating on said substrate.

20. The method as recited in claim 16 wherein the step of magnetically energizing the line-of-sight plasma column is performed in part by means of a magnetic circuit having at least two core members; and further including the step of varying selection of said core members to respectively accommodate varied cathode source materials.

21. The method as recited in claim 20, wherein the step of variably selecting said core members comprises selectively providing a plurality of core members to define a magnetic circuit having a magnetic field that intersects said plasma column along its line-of-sight length, wherein the strength and shape of said field can be accurately varied.

22. A method of forming virtually macroparticle free coatings on a substrate within an electric arc vapor deposition system which creates a plasma of coating material by striking an electric arc between a consumable cathode and an anode within an evacuated deposition chamber, comprising the steps of:

a. evacuating the deposition chamber to a predetermined pressure;

b. creating and maintaining an electric arc between an evaporation surface of a cathode and an anode, to produce a plasma of coating material projecting from said evaporation surface;

c. directing a column of said plasma of coating material in line-of-sight manner along an axis line between said cathode evaporation surface and a substrate within said deposition chamber;

d. magnetically controlling the intensity and movement of the electric arc on the cathode evaporation surface so as to minimize generation of macroparticle emission into the column of plasma material; and e. applying a magnetic field to said column of plasma material, by passing the column of plasma material through a core configuration while maintaining said line-of-sight manner of said column of plasma material toward the substrate, to increase the core energy of electrons of said column of plasma material sufficiently to vaporize macroparticles within said column; whereby said column of plasma material arrives virtually macroparticle free at said substrate.

23. The method as recited in claim 22 further including the steps of:

a. introducing a reactive gas into the deposition chamber; and b. ionizing said reactive gas adjacent the cathode evaporation surface to promote formation of a compound layer at the cathode evaporation surface to minimize generation of macroparticle emission into the column of plasma material.

24. The method as recited in claim 22, further including the step of applying a magnetic field to the column of plasma material while maintaining its line-of-sight movement to significantly increase the ionization, the ionic charge and the ionization fraction of said column of plasma material prior to reaching said substrate.

25. The method as recited in claim 24, including the step of coating a surface of the substrate with said line-of-sight column of plasma material.

26. The method as recited in claim 25, further including the step of recovering from said deposition chamber the coated substrate having an adherent homogeneous, dense and virtually macroparticle free coating.

27. An enhanced electric arc vapor deposition system comprising:

a. a vacuum deposition chamber;

b. an anode operatively associated with said deposition chamber;

c. a consumable cathode source mounted within said deposition chamber, said cathode source defining an evaporation surface;

d. a substrate;

e. means for supporting said substrate in spaced line of-sight relation to said cathode evaporation surface within said vacuum deposition chamber;

f. means operatively connected to said anode and said cathode source for establishing and maintaining an electric arc between said cathode evaporation surface and said anode, thereby creating a column of plasma material projecting in line-of-sight manner along an axis line extending from said cathode evaporation surface toward said substrate; and g. magnetic field generating means mounted so as to maintain the line-of-sight relation between said cathode evaporation surface and said substrate, for creating a magnetic field having:

i. strength and orientation relative to said cathode evaporation surface to control the intensity and movement of said arc over said cathode evaporation surface so as to minimize emission of macroparticles from said cathode evaporation surface into said column of plasma material; and ii. strength and orientation relative to said column of plasma material to increase the core energy of electrons of said column of plasma material sufficiently to cause macroparticle vaporization therein, and to significantly increase the ionization, the ionic charge and the ionization fraction of said column of plasma material at said substrate;

whereby highly ionized reduced macroparticle plasma material from said cathode impinges upon said substrate.

28. The apparatus as recited in claim 27, wherein said cathode comprises titanium.

29. The apparatus as recited in claim 27, wherein said cathode comprises carbon-based material.

30. The apparatus as recited in claim 27, wherein said cathode comprises a material with a high melting point or vaporization temperature of the order of or greater than 2000° kelvin, or which displays negative temperature coefficient of resistivity.

31. The apparatus as recited in claim 27, wherein said magnetic field generating means includes means for creating said magnetic field having strength and orientation relative to said cathode evaporation surface sufficient to cause rapid confined movement of the arc across said cathode evaporation surface and to split the arc into multiple cathode spots on the cathode evaporation surface.

32. The apparatus as recited in claim 27, further including:
  a. means for introducing a reactive gas into the vacuum deposition chamber; and
  b. means for ionizing said reactive gas and for retaining large numbers of ions of said reactive gas directly adjacent said cathode evaporation surface; thereby causing fewer and smaller macroparticles to be emitted from said cathode evaporation surface.

33. The apparatus as recited in claim 27, wherein said magnetic field generating means creates said magnetic field having an orientation that engages said column of plasma material along an axial focus zone intermediate said cathode evaporation surface and said substrate, and a strength that increases the ionization fraction of the column of plasma material leaving said axial focus zone to about 100 percent.

34. The method of making a hard, smooth film coating directly on a substrate by electric arc vapor deposition from a solid carbon source, said method comprising the steps of:
  a. forming a line-of-sight plasma within a deposition zone, under vacuum conditions, by means of an electric arc passing between an arc spot on a consumable carbon-based cathode and an anode, said line-of-sight extending in the deposition zone between said cathode and a substrate spaced therefrom;
  b. magnetically controlling the arc at the cathode to increase the stability and lifetime of the arc spot on the cathode, thereby leading to reduction of macroparticle emission;
  c. magnetically converging the line-of-sight plasma by a magnetic field having strength and orientation for increasing the energy of electrons in said plasma core sufficient to atomize macroparticles;
  d. preparing a substrate within the deposition zone by impacting the line-of-sight plasma from step (c) onto a surface of the substrate to nucleate the substrate surface in preparation for coating;
  e. coating the nucleated substrate surface with said line-of-sight plasma from step (c); and
  f. recovering from the plasma deposition zone said substrate having an adherent diamond-like carbon coating directly thereon, said coating being homogeneous, dense, smooth and extremely hard.

35. The method of claim 34, wherein said plasma used in said coating step is substantially free of macroparticles.

36. The method of claim 34, in which the substrate is a metal substrate.

37. The method of claim 34, in which the substrate is a ferrous metal.

38. The method of claim 34, wherein the diamond-like coating has a thickness greater than about 3 microns.

* * * * *

UNITED STATES PATENT AND TRADEMARK OFFICE
CERTIFICATE OF CORRECTION

PATENT NO. : 5,458,754

DATED : October 17, 1995

INVENTOR(S) : Paul E. Sathrum et al.

It is certified that error appears in the above-identified patent and that said Letters Patent is hereby corrected as shown below:

On column 6, line 31, please delete "part" and substitute therefore --art--

On column 14, line 27, please delete "prevent" and substitute therefore --present--

On column 15, line 6, please delete "accomodating" and substitute therefore --accommodating--

On column 16, line 24, please delete "lawyers" and substitute therefore --layers--

On column 18, line 54, please delete "filmed" and substitute therefore --film--

On column 21, line 53 (claim 4), please delete "material" after the word "graphite"

On column 21, line 58 (claim 6), please delete "difficult to" after the word "comprises"

On column 23, line 18 (claim 17), please insert --in-- after the word "electrons"

On column 24, line 63 (claim 27), please delete "core" after the word "the"

On column 26, line 15 (claim 34), please delete "core" after the word "plasma"

Signed and Sealed this

Twenty-first Day of May, 1996

Attest:

BRUCE LEHMAN

Attesting Officer

Commissioner of Patents and Trademarks